(12) United States Patent
Murakami et al.

(10) Patent No.: US 10,359,696 B2
(45) Date of Patent: Jul. 23, 2019

(54) IMPRINT APPARATUS, AND METHOD OF MANUFACTURING ARTICLE

(71) Applicant: CANON KABUSHIKI KAISHA, Tokyo (JP)

(72) Inventors: Yosuke Murakami, Utsunomiya (JP); Tatsuya Hayashi, Utsunomiya (JP); Kazuki Nakagawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 939 days.

(21) Appl. No.: 14/515,927

(22) Filed: Oct. 16, 2014

(65) Prior Publication Data

US 2015/0108674 A1    Apr. 23, 2015

(30) Foreign Application Priority Data

Oct. 17, 2013    (JP) .................................. 2013-216754
Dec. 26, 2013    (JP) .................................. 2013-270124

(51) Int. Cl.
*G03F 7/00*    (2006.01)
*G03F 7/20*    (2006.01)
(Continued)

(52) U.S. Cl.
CPC .......... *G03F 7/0002* (2013.01); *B29C 43/021* (2013.01); *G03F 7/70425* (2013.01); (Continued)

(58) Field of Classification Search
None
See application file for complete search history.

(56) References Cited

U.S. PATENT DOCUMENTS 5,563,684 A * 10/1996 Stagaman .............. G03B 27/58
                                                    355/47
6,980,282 B2 * 12/2005 Choi ....................... G03F 7/707
                                                    355/72
(Continued)

FOREIGN PATENT DOCUMENTS

CN         1637617 A     7/2005
CN       101008789 A     8/2007
(Continued)

OTHER PUBLICATIONS

Office Action issued in Chinese Appl. No. 201410551185.5 dated Feb. 1, 2018. English Translation provided.

*Primary Examiner* — Matthew J Daniels
*Assistant Examiner* — Manley L Cummins, IV
(74) *Attorney, Agent, or Firm* — Rossi, Kimms & McDowell LLP

(57) ABSTRACT

The present invention provides an imprint apparatus which performs an imprint process of forming a pattern on a substrate by using a mold, the apparatus comprising a heating unit configured to heat a region to be imprinted on the substrate, thereby deforming the region, and a processing unit configured to determine, as a region to be imprinted first, one region out of a first region and second region to be imprinted, and determine the other region as a region to be imprinted subsequently, wherein an influence on the other region in a case where the heating unit deforms the one region is smaller than an influence on the one region in a case where the heating unit deforms the other region.

16 Claims, 15 Drawing Sheets

(51) Int. Cl.
*B29C 43/02* (2006.01)
*B29K 101/00* (2006.01)
*B29L 31/00* (2006.01)
*B29C 43/52* (2006.01)
*B29C 43/36* (2006.01)
*G03F 9/00* (2006.01)

(52) U.S. Cl.
CPC .... *G03F 7/70483* (2013.01); *B29C 2043/025* (2013.01); *B29C 2043/3634* (2013.01); *B29C 2043/522* (2013.01); *B29K 2101/00* (2013.01); *B29L 2031/001* (2013.01); *G03F 9/7019* (2013.01); *G03F 2007/2067* (2013.01)

(56) References Cited

U.S. PATENT DOCUMENTS

| | | | |
|---|---|---|---|
| 7,927,089 B2 * | 4/2011 | Seki | B82Y 10/00 264/293 |
| 9,201,298 B2 | 12/2015 | Nakagawa et al. | |
| 2007/0082280 A1 * | 4/2007 | Menchtchikov | G03F 7/70341 430/30 |
| 2009/0279061 A1 * | 11/2009 | Jacobs | G03F 7/70341 355/30 |
| 2010/0003830 A1 * | 1/2010 | Itoh | B29C 35/0894 438/758 |
| 2011/0273684 A1 * | 11/2011 | Owa | B29C 43/003 355/53 |
| 2013/0093113 A1 * | 4/2013 | Hayashi | G03F 7/0002 264/40.1 |
| 2015/0002832 A1 * | 1/2015 | Cadee | H01L 21/6875 355/72 |

FOREIGN PATENT DOCUMENTS

| | | |
|---|---|---|
| CN | 102162992 A | 8/2011 |
| JP | 06-204116 A | 7/1994 |
| JP | 4246174 B2 | 4/2009 |
| JP | 2012004515 A | 1/2012 |
| JP | 2013-089663 A | 5/2013 |
| JP | 2013098291 A | 5/2013 |
| JP | 2013102132 A | 5/2013 |
| JP | 2013-175709 A | 9/2013 |
| KR | 20130040727 A | 4/2013 |
| KR | 1020130040723 A | 4/2013 |
| WO | 2013/111606 A1 | 8/2013 |
| WO | 2013117518 A2 | 8/2013 |

* cited by examiner

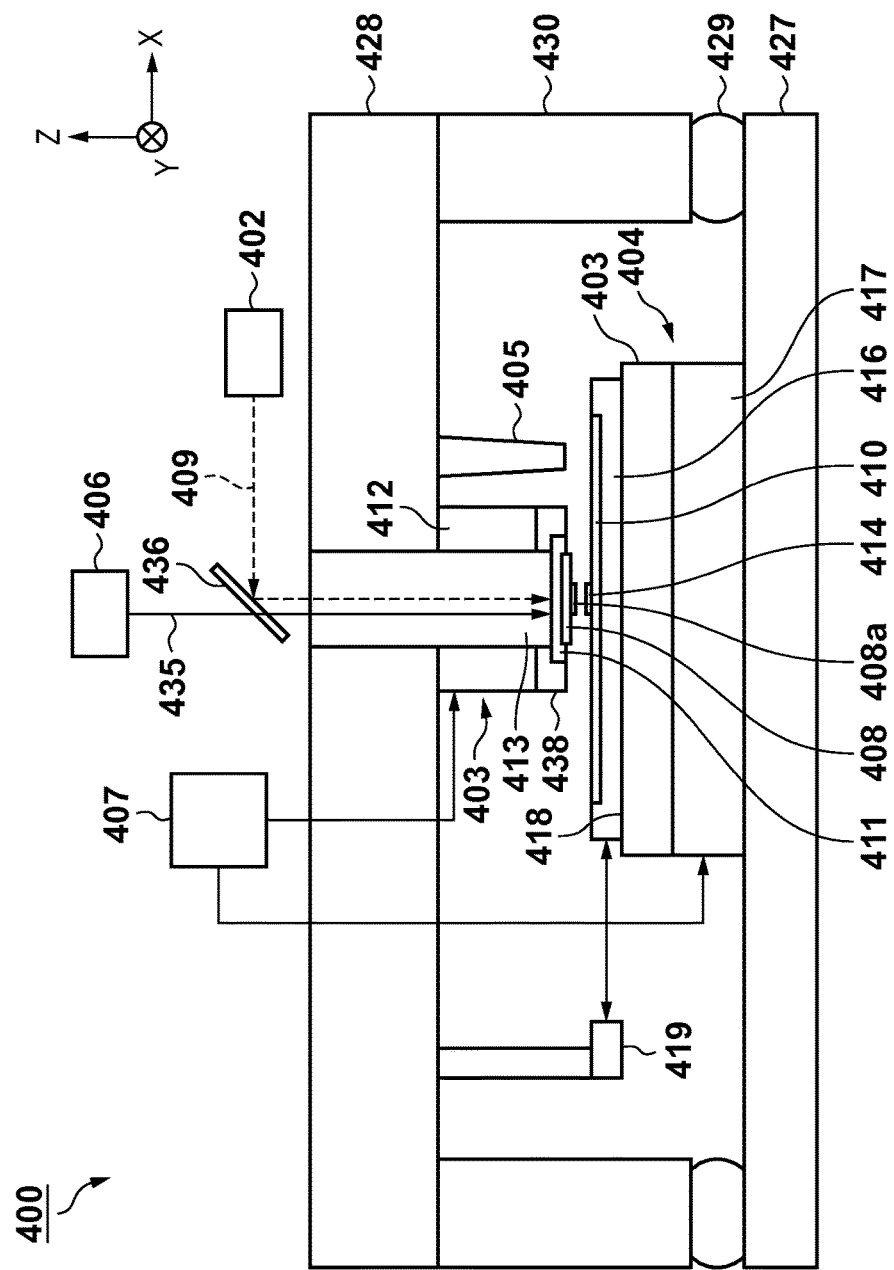

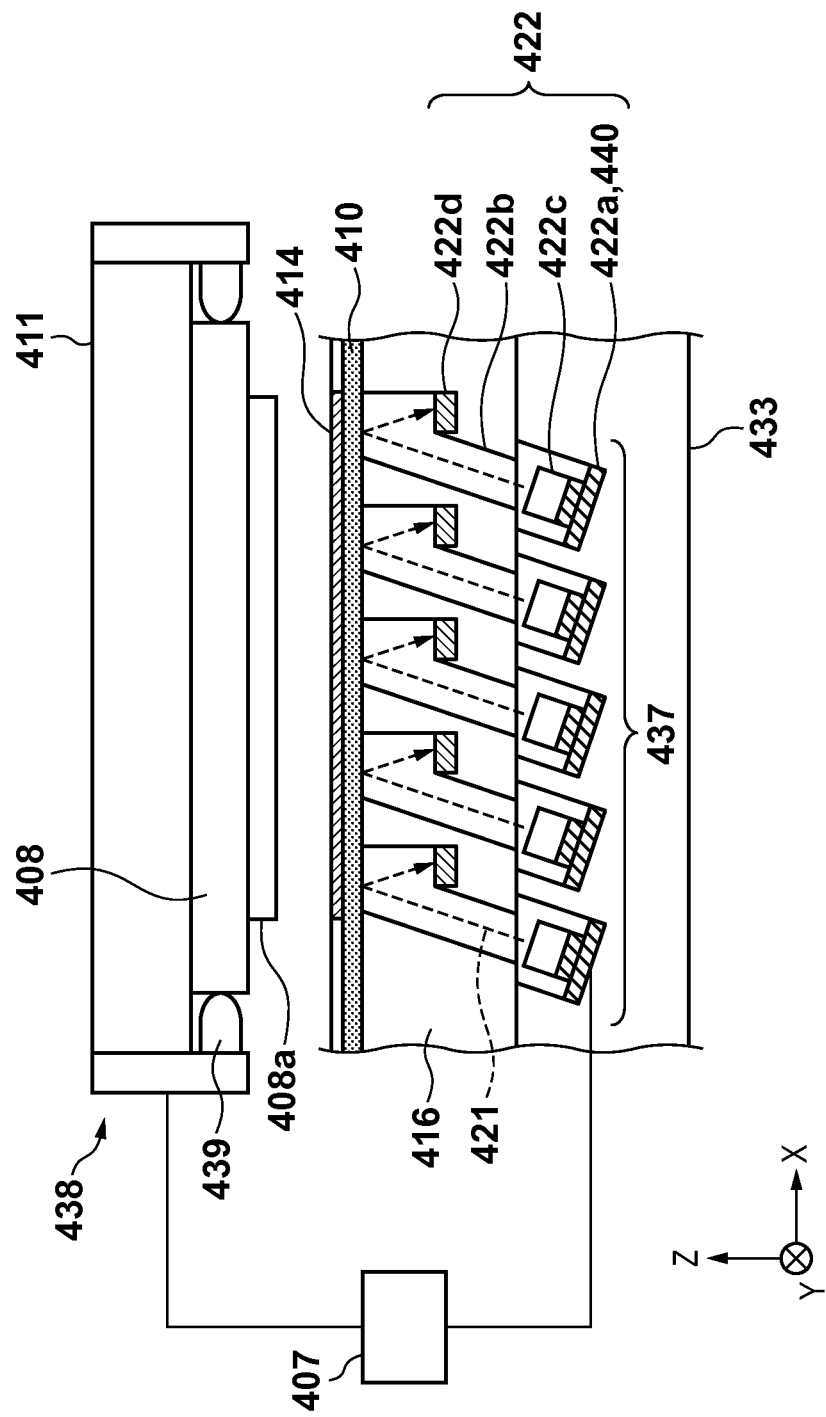

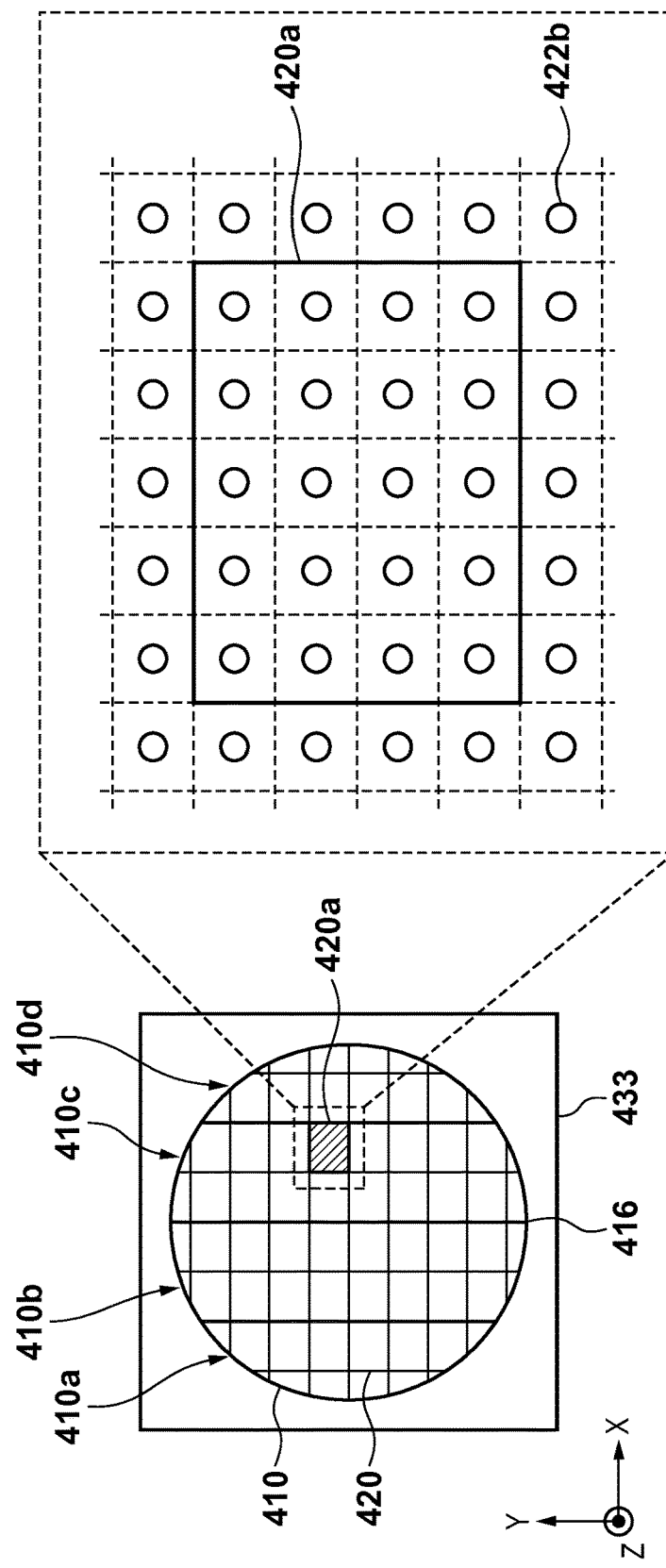

IMPRINT APPARATUS, AND METHOD OF MANUFACTURING ARTICLE

BACKGROUND OF THE INVENTION

Field of the Invention

The present invention relates to an imprint apparatus, and a method of manufacturing an article.

Description of the Related Art

An imprint technique of forming an imprint material on a substrate by using a mold has received attention as one of mass production lithography techniques for a magnetic storage medium, semiconductor device, and the like. An imprint apparatus using this technique cures an imprint material supplied on a substrate while the imprint material and a mold are in contact with each other. The imprint apparatus then separates (releases) the mold from the cured imprint material, forming a pattern on the substrate.

In the manufacture of a semiconductor device or the like, a mold needs to be superposed at high accuracy in a shot region formed on a substrate. Japanese Patent Laid-Open No. 2013-89663 has proposed a method of heating a substrate to deform a shot region. A target shot region to be imprinted may be deformed by heating another shot region. Therefore, the imprint process in each shot region to be imprinted may be performed so as to reduce the influence of heating another shot region.

Japanese Patent Laid-Open No. 06-204116 has proposed a method in which a plurality of Peltier elements are arranged in a substrate holding unit configured to hold a substrate, and the substrate temperature is controlled to deform a shot region. As described in Japanese Patent Laid-Open No. 06-204116, in order to control the substrate temperature at high accuracy by using a thermoelectric element such as a Peltier element, the thermoelectric element, or a member whose temperature is controlled by the thermoelectric element may be brought into tight contact with the substrate. However, the present inventor has found that when, for example, a particle adheres to a substrate or a substrate tilts, the thermoelectric element or member cannot be brought into tight contact with the substrate, and it may become difficult to control the substrate temperature at high accuracy.

SUMMARY OF THE INVENTION

The present invention provides an imprint apparatus advantageous for, for example, superposing a substrate and mold at high accuracy.

According to one aspect of the present invention, there is provided an imprint apparatus which performs an imprint process of forming a pattern on a substrate by using a mold, the apparatus comprising: a heating unit configured to heat a region to be imprinted on the substrate, thereby deforming the region; and a processing unit configured to determine, as a region to be imprinted first, one region out of a first region and second region to be imprinted, and determine the other region as a region to be imprinted subsequently, wherein an influence on the other region in a case where the heating unit deforms the one region to bring the one region close to a target shape is smaller than an influence on the one region in a case where the heating unit deforms the other region to bring the other region close to the target shape.

According to one aspect of the present invention, there is provided an imprint apparatus which performs an imprint process of forming a pattern of an imprint material in a shot region formed on a first surface of a substrate by using a mold including a pattern region in which a pattern of the mold is formed, the apparatus comprising: a substrate holding unit configured to hold the substrate; and a control unit, wherein the substrate holding unit includes a heating unit configured to irradiate a second surface opposite to the first surface with light to apply heat to the substrate and deform the shot region, and the control unit controls the heating unit to make a shape difference between the pattern region and the shot region fall within an allowable range.

Further features of the present invention will become apparent from the following description of exemplary embodiments with reference to the attached drawings.

BRIEF DESCRIPTION OF THE DRAWINGS

FIG. 11 is a schematic view showing the arrangement of an imprint apparatus according to the fourth embodiment;

FIG. 12 is a view showing the arrangement of a substrate holding unit in the imprint apparatus according to the fourth embodiment;

FIG. 13 is a view showing the substrate holding unit when viewed from the Z direction;

DESCRIPTION OF THE EMBODIMENTS

Figure 1:
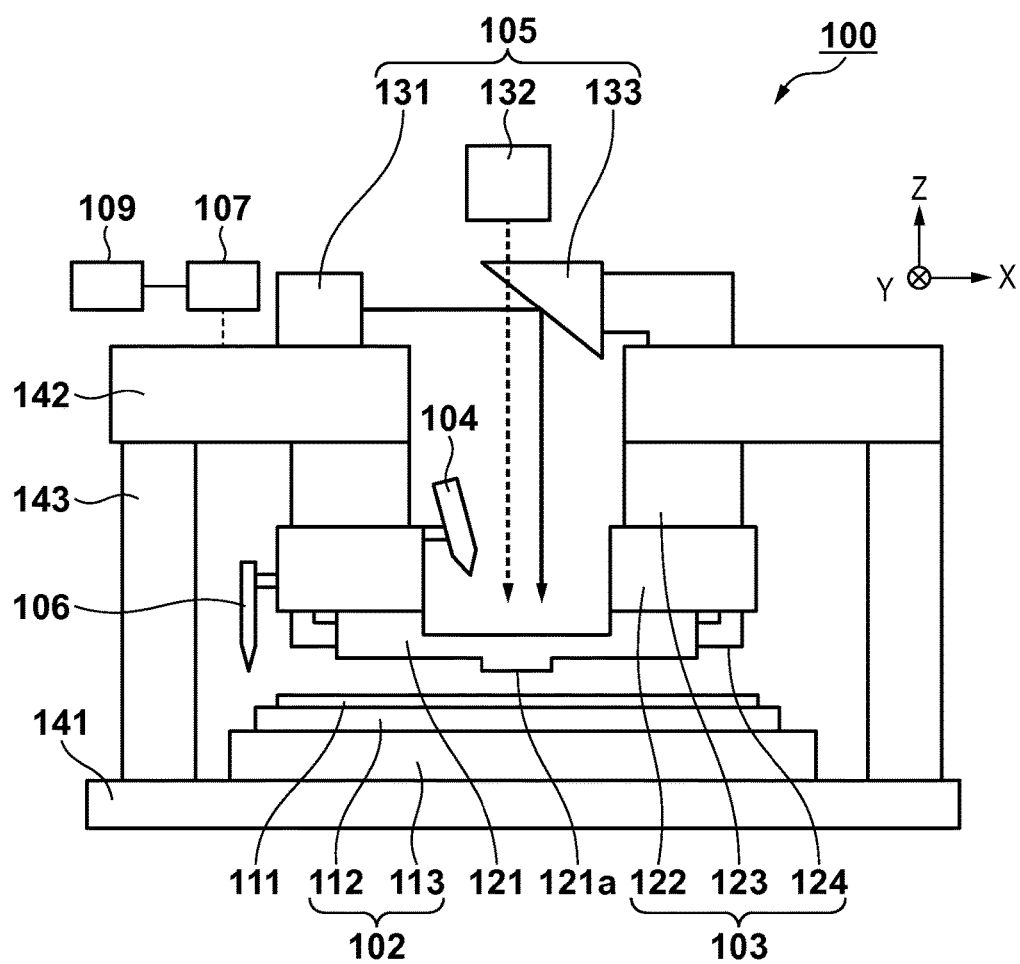
FIG. 1 is a view showing an imprint apparatus according to the first embodiment.

Exemplary embodiments of the present invention will be described below with reference to the accompanying drawings. Note that the same reference numerals denote the same members throughout the drawings, and a repetitive description thereof will not be given. In the respective drawings, directions perpendicular to each other on a plane parallel to the surface of a substrate are defined as X and Y directions, and a direction perpendicular to the surface of a substrate is defined as a Z direction.

<First Embodiment>

An imprint apparatus 100 according to the first embodiment of the present invention will be described with reference to FIG. 1. The imprint apparatus 100 is used to manufacture a semiconductor device or the like. The imprint apparatus 100 performs an imprint process of forming an imprint material on a substrate by using a mold 121 to form a pattern on a substrate 111. For example, the imprint apparatus 100 cures the imprint material (resin) on the substrate while the mold 121 on which a pattern is formed is in contact with the imprint material. Then, the imprint apparatus 100 widens the interval between the substrate 111 and the mold 121 to separate the mold 121 from the cured imprint material. As a result, the imprint apparatus 100 can transfer the pattern onto the substrate. Examples of a method of curing an imprint material are a heat cycle method using heat, and a photo-curing method using light. The imprint apparatus 100 according to the first embodiment adopts the photo-curing method. The photo-curing method is a method of supplying an uncured ultraviolet-curing resin (to be referred to as a resin hereinafter) as an imprint material onto a substrate, and irradiating the resin with ultraviolet rays while the mold 121 and the resin are in contact with each other, thereby curing the resin. By releasing the mold 121 from the resin after curing the resin by ultraviolet irradiation, the pattern can be formed on the substrate.

FIG. 1 is a view showing the imprint apparatus 100 according to the first embodiment. The imprint apparatus 100 includes a substrate stage 102 which holds the substrate 111, a mold stage 103 which holds the mold 121, an alignment measurement unit 104, an irradiation unit 105, and a resin supply unit 106. The mold stage 103 is fixed to a bridge plate 142 supported by a base plate 141 via a column 143. The substrate stage 102 is fixed to the base plate 141. The imprint apparatus 100 also includes a control unit 107 and processing unit 109. The control unit 107 includes a CPU and memory, and controls the imprint process (controls each unit of the imprint apparatus 100). The processing unit 109 is constituted by, for example, a computer including a CPU and memory. Based on information (to be referred to as shape information hereinafter) of a shape in each of a plurality of shot regions 108 formed on a substrate, the processing unit 109 determines the order of the shot regions 108 to be imprinted.

As the substrate 111, for example, a single-crystal silicon substrate, SOI (Silicon On Insulator) substrate, or the like is usable. The resin supply unit 106 (to be described later) supplies a resin (ultraviolet-curing resin) to the upper surface (process target surface) of the substrate 111. The mold 121 is generally made of a material such as quartz through which ultraviolet rays can pass. A projection-and-recess pattern to be transferred to the substrate 111 is formed in a partial region (pattern region 121a) on the substrate-side surface of the mold 121.

The substrate stage 102 includes a substrate holding unit 112 and substrate driving unit 113. When bringing the pattern region 121a of the mold 121 and the resin on the substrate into contact with each other, the substrate stage 102 moves the substrate 111 in the X and Y directions to align the substrate 111 and mold 121. The substrate holding unit 112 holds the substrate 111 by a vacuum chucking force, electrostatic chucking force, or the like. The substrate driving unit 113 mechanically holds the substrate holding unit 112, and drives the substrate holding unit 112 (substrate 111) in the X and Y directions. As the substrate driving unit 113, for example, a linear motor may be used, and the substrate driving unit 113 may be constituted by a plurality of driving systems such as a coarse driving system and fine driving system. The substrate driving unit 113 may have a driving function of driving the substrate 111 in the Z direction, a position adjustment function of driving the substrate 111 to rotate in the θdirection (rotational direction about the Z-axis), and adjusting the position of the substrate, a tilt function of correcting the tilt of the substrate 111, and the like.

The mold stage 103 includes a mold holding unit 122 which holds the mold 121 by a vacuum chucking force, electrostatic chucking force, or the like, and a mold driving unit 123 which drives the mold holding unit 122 in the Z direction. The mold holding unit 122 and mold driving unit 123 have opening regions at their central portions (insides) so that light emitted by the irradiation unit 105 irradiates the substrate 111 via the mold 121. A deformation including a component such as a magnification component or trapezoid component may have occurred in the mold 121 owing to a manufacturing error, heat deformation, or the like. Considering this, the mold stage 103 may include a deformation unit 124 which deforms the mold 121 by applying forces to a plurality of portions on the side surface of the mold 121. For example, the deformation unit 124 is constituted by a plurality of actuators so arranged as to apply forces to a plurality of portions on the respective side surfaces of the mold 121. By individually applying forces to a plurality of portions on the respective side surfaces of the mold 121 by the plurality of actuators, the deformation unit 124 can correct the deformation of the mold 121 in the pattern region 121a. As the actuator of the deformation unit 124, for example, a linear motor, air cylinder, or piezoelectric actuator is used.

The mold driving unit 123 includes an actuator such as a linear motor or air cylinder, and drives the mold holding unit 122 (mold 121) in the Z direction to bring the pattern region 121a of the mold 121 and the resin on the substrate into contact with each other or separate them from each other. Since the mold driving unit 123 needs to perform high-accuracy positioning when bringing the mold 121 and the resin on the substrate into contact with each other, it may be constituted by a plurality of driving systems such as a coarse driving system and fine driving system. In addition to the function of driving in the Z direction, the mold driving unit 123 may have a position adjustment function of adjusting the position of the mold in the X and Y directions and the θ direction, a tilt function of correcting the tilt of the mold 121, and the like. In the imprint apparatus 100 according to the first embodiment, the mold driving unit 123 performs an operation of changing the distance between the substrate 111 and the mold 121. Alternatively, the substrate driving unit 113 of the substrate stage 102 may perform this operation, or both of the mold driving unit 123 and substrate driving unit 113 may relatively perform it.

The alignment measurement unit 104 measures the difference (to be referred to as a shape difference hereinafter) between the shape of the pattern region 121a of the mold 121 and the shape of the shot region 108 formed on the substrate. An example of a method of measuring a shape difference is a method of detecting a plurality of alignment marks respectively formed in the pattern region 121a of the mold 121 and the shot region 108 on the substrate. The alignment marks of the pattern region 121a and the alignment marks of the shot region 108 are arranged to overlap each other when the pattern region 121a and shot region 108 are made to coincide with each other in the X and Y directions. The alignment measurement unit 104 superposes and observes the alignment marks of the pattern region 121a and the corresponding alignment marks of the shot region 108 to detect position deviation amounts between them. In this manner, the alignment measurement unit 104 can measure the shape difference between the pattern region 121a and the shot region 108.

The resin supply unit 106 supplies the resin (uncured resin) onto the substrate (coats the substrate with the resin). As described above, the imprint apparatus 100 according to the first embodiment uses, as an imprint material, an ultraviolet-curing resin having a property in which the resin is cured by ultraviolet irradiation. However, the resin is not limited to this, and a resin (imprint material) to be supplied from the resin supply unit 106 to the substrate 111 can be appropriately selected under various conditions in semiconductor device manufacturing steps. The amount of resin dispensed from the dispense nozzle of the resin supply unit 106 can be appropriately determined in consideration of the thickness of a pattern to be formed on the resin on the substrate, the density of the pattern, and the like. To sufficiently fill the pattern formed in the pattern region 121a of the mold 121 with the resin supplied on the substrate, the process may wait for the lapse of a predetermined time while the mold 121 and the resin are in contact with each other.

The substrate 111 to be imprinted by the imprint apparatus 100 is loaded into the imprint apparatus 100 after a heat process or the like in a deposition step such as sputtering in a series of semiconductor device manufacturing steps. Therefore, a deformation including a component such as a magnification component, trapezoid component, arcuate component, or barrel component may have occurred in the shot region 108 on the substrate. In this case, it may be difficult to implement high-accuracy alignment between the pattern region 121a of the mold 121 and the shot region 108 on the substrate by only deforming the pattern region 121a of the mold 121 by the deformation unit 124. It is desirable to deform the shot region 108 on the substrate so that the shot region 108 fits the shape of the pattern region 121a of the mold 121 deformed by the deformation unit 124. To achieve this, the imprint apparatus 100 according to the first embodiment includes a heating unit 132 which deforms the shape of the shot region 108 by heating the substrate 111. The arrangement of the irradiation unit 105 including an exposure unit 131 and the heating unit 132 will be explained below.

The irradiation unit 105 can include the exposure unit 131 which emits light for curing a resin on a substrate, the heating unit 132 which emits light for heating the substrate 111, and an optical member 133 which guides light emitted by the exposure unit 131 and light emitted by the heating unit 132 onto a substrate. The exposure unit 131 can include a light source which emits light (ultraviolet rays) for curing a resin on a substrate, and a plurality of optical elements which adjust light emitted by the light source into light appropriate for the imprint process. The heating unit 132 can include a light source which emits light for heating the substrate 111, and an optical system for changing the illuminance distribution of light irradiating the substrate 111 from the light source. The light source of the heating unit 132 emits light having a wavelength (for example, 400 nm to 2,000 nm) suited to heat the substrate 111 without curing a resin supplied on the substrate. The optical system of the heating unit 132 includes an optical element which changes the illuminance distribution of light irradiating the substrate 111 from the light source of the heating unit 132 so that the heating distribution in the shot region 108 becomes a desired distribution, that is, the shape of the shot region 108 becomes a target shape. As the optical element included in the optical system of the heating unit 132, for example, a DMD (Digital Micromirror Device), or liquid crystal element is used.

For example, when a deformation including a magnification component has occurred in the shot region 108, the heating unit 132 irradiates the shot region 108 with light to uniform the thermal dose (amount of heating) in the shot region 108. Heat can be applied to the substrate 111 to uniform the temperature in the shot region, and the shot region 108 in which a deformation including a magnification component has occurred can be deformed into a target shape. To the contrary, when a deformation including a trapezoid component has occurred in the shot region 108, the heating unit 132 irradiates the shot region 108 with light to decrease the thermal dose in the shot region 108 linearly in a direction from the short side to the long side. Heat can be applied to the substrate 111 to decrease the temperature in the shot region linearly in a direction from the short side to the long side, and the shot region 108 in which a deformation including a trapezoid component has occurred can be deformed into a target shape. The optical member 133 can include, for example, a beam splitter which reflects light (ultraviolet rays) emitted by the exposure unit 131, and transmits light (wavelength of 400 nm to 2,000 nm) emitted by the heating unit 132.

Figure 2:
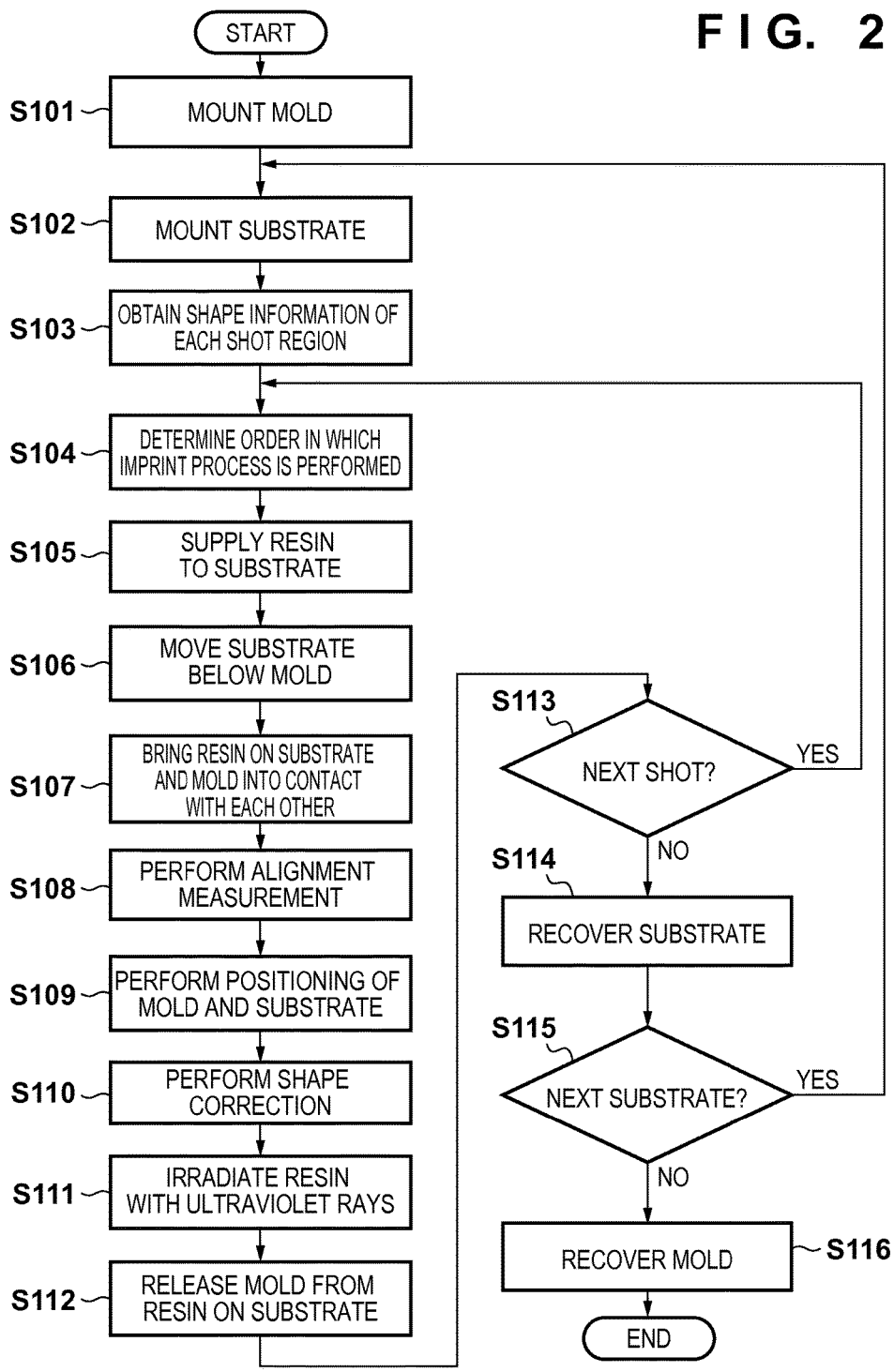
FIG. 2 is a flowchart showing an operation sequence in an imprint process.

An imprint process of transferring the pattern of the mold 121 to the shot region 108 on the substrate in the imprint apparatus 100 having this arrangement according to the first embodiment will be explained with reference to FIG. 2. FIG. 2 is a flowchart showing an operation sequence in the imprint process of transferring the pattern of the mold 121 to the shot region 108 on the substrate.

In step S101, the control unit 107 controls a mold transport mechanism (not shown) to transport the mold 121 below the mold holding unit 122, and controls the mold holding unit 122 to hold the mold 121. Accordingly, the mold 121 is arranged inside the imprint apparatus 100. In step S102, the control unit 107 controls a substrate transport mechanism (not shown) to transport the substrate 111 onto the substrate holding unit 112, and controls the substrate holding unit 112 to hold the substrate 111. Thus, the substrate 111 is arranged inside the imprint apparatus 100. In step S103, the processing unit 109 obtains shape information in each of the plurality of shot regions 108 formed on the substrate. For example, the above-mentioned alignment measurement unit 104 may detect the position of an alignment mark formed in each shot region 108, and the processing unit 109 may obtain shape information of each shot region 108 based on the detected position of the alignment mark. Alternatively, the processing unit 109 may obtain shape information of each shot region 108 measured by an external apparatus. In step S104, based on the shape information of each shot region 108 that has been obtained in step S103, the processing unit 109 determines the order of the shot regions 108 to be imprinted. The method of determining the order in which the imprint process is performed will be described later.

In step S105, the control unit 107 controls the resin supply unit 106 to supply a resin (uncured resin) to the target shot region 108 to be imprinted. In step S106, the control unit 107 controls the substrate driving unit 113 to move the substrate 111 so that the resin-supplied shot region 108 is arranged below the pattern region 121a of the mold 121. In step S107, the control unit 107 controls the mold driving unit 123 to bring the pattern region 121a of the mold 121 and the resin on the substrate into contact with each other, that is, to decrease the distance between the substrate 111 and the mold 121. In step S108, the control unit 107 controls the alignment measurement unit 104 to detect an alignment mark formed in the shot region 108 and an alignment mark formed on the mold 121. The alignment measurement unit 104 can measure (perform alignment measurement) the shape difference between the shot region 108 on the substrate and the region 121a on the mold.

In step S109, the control unit 107 controls the substrate driving unit 113 to move the substrate 111 based on the result of alignment measurement in step S108, and positions the substrate 111 and mold 121. Positioning in step S109 is correction of a translation shift component and rotation component out of the shape difference between the shot region 108 on the substrate and the pattern region 121a of the mold 121. The shape difference may include a deformation component such as a magnification component or trapezoid component, in addition to the translation shift component and rotation component. In step S110, the control unit 107 controls the deformation unit 124 and heating unit 132 to perform correction (shape correction) of the shape difference (for example, a magnification component or trapezoid component) between the shot region 108 and the pattern region 121a. Based on the shape information of each shot region 108 that has been obtained in step S103, the processing unit 109 can determine a thermal dose to be applied to the substrate 111 by the heating unit 132. However, this thermal dose may be adjusted in accordance with the order of the shot regions 108 which has been determined in step S104 and in which the imprint process is performed. That is, the thermal dose of the target shot region 108 to be imprinted may be adjusted based on the thermal dose of the shot region 108 previously having been imprinted, in consideration of the influence of heating the shot region 108 previously having been imprinted.

In step S111, the control unit 107 controls the exposure unit 131 to irradiate, with ultraviolet rays, the resin in contact with the pattern region 121a of the mold 121, thereby curing the resin. In step S112, the control unit 107 controls the mold driving unit 123 to separate (release) the pattern region 121a of the mold 121 from the resin on the substrate, that is, to increase the distance between the substrate 111 and the mold 121. In step S113, the control unit 107 determines whether the shot region 108 (next shot region 108) in which the pattern of the mold 121 is subsequently transferred exists on the substrate. If the next shot region 108 exists, the process returns to step S104. If the next shot region 108 does not exist, the process advances to step S114. In step S114, the control unit 107 controls the substrate transport mechanism (not shown) to recover the substrate 111 from the substrate holding unit 112. In step S115, the control unit 107 determines whether there is the substrate 111 (next substrate 111) to be imprinted subsequently. If there is the next substrate 111, the process returns to step S102. If there is no next substrate 111, the process advances to step S116. In step S116, the control unit 107 controls the mold transport mechanism (not shown) to recover the mold 121 from the mold holding unit 122.

Figure 3:
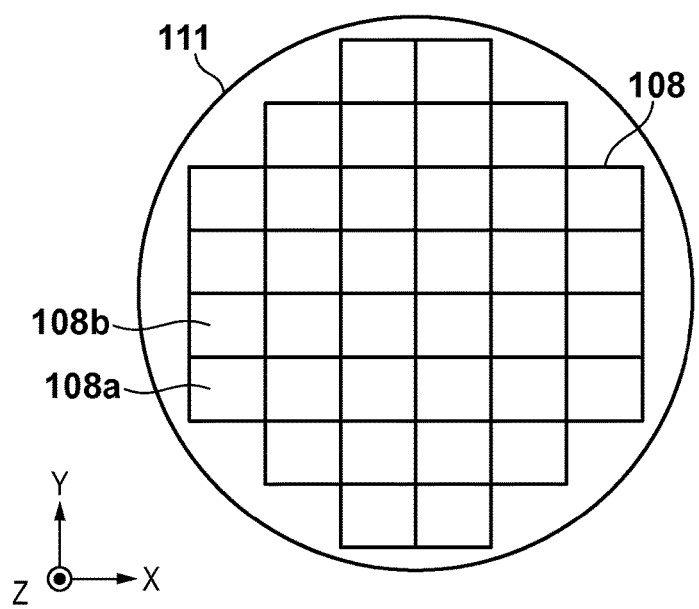
FIG. 3 is a view showing the arrangement of a plurality of shot regions formed on a substrate.

Alignment between the shot region 108 on the substrate and the pattern region 121a of the mold 121 in the imprint apparatus 100 having the above-described arrangement according to the first embodiment will be explained. FIG. 3 is a view showing the arrangement of the plurality of shot regions 108 formed on the substrate. A deformation including a component such as a magnification component, trapezoid component, arcuate component, or barrel component may occur in each of the plurality of shot regions 108. The following description assumes that a deformation including a trapezoid component has occurred in each shot region 108, and the initial shape of each shot region 108 is a trapezoidal shape. Also, assume that no deformation has occurred in the pattern region 121a of the mold 121, and the initial shape of the pattern region 121a is a design shape (rectangular shape). The initial shape is a shape of the shot region 108 (or the pattern region 121a) before deformation by the heating unit 132 (or the deformation unit 124).

Figure 4A:
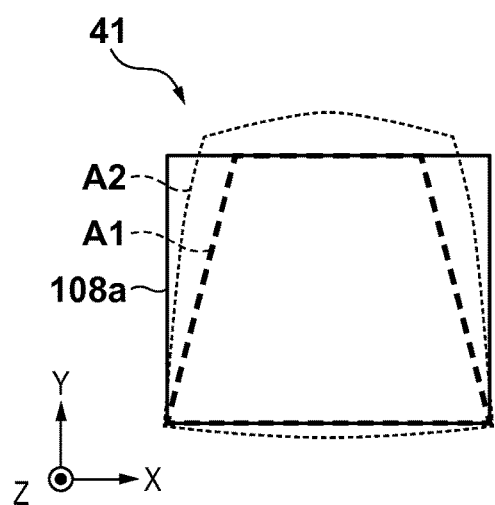
FIGS. 4A and 4B are views for explaining alignment between the shot region and the pattern region of a mold.
Figure 4B:
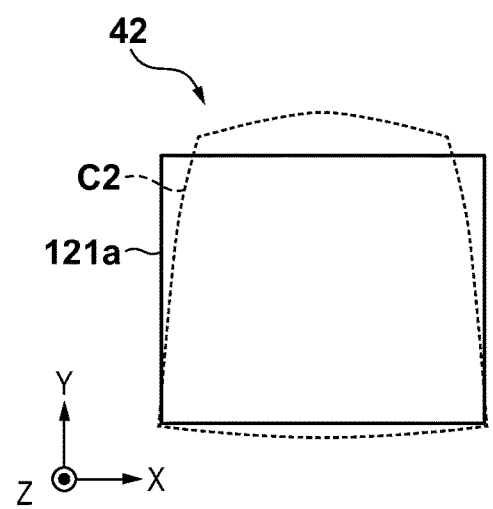

First, alignment between one shot region 108 (for example, a first shot region 108a) and the pattern region 121a of the mold 121 will be explained with reference to FIGS. 4A and 4B. In FIG. 4A, 41 is a view showing the first shot region 108a formed on the substrate 111. As described above, the initial shape of the first shot region 108a is deformed into a trapezoidal shape A1. In FIG. 4B, 42 is a view showing the pattern region 121a of the mold 121. As described above, the initial shape of the pattern region 121a is a rectangular shape C1 which is a design shape.

In order to align the first shot region 108a and pattern region 121a, the control unit 107 controls the deformation unit 124 to deform the pattern region 121a so that the shape C1 of the pattern region 121a comes close to the trapezoidal shape. At this time, if forces are applied in the ±X directions by the deformation unit 124 to a plurality of portions on the side surfaces of the mold 121 in the ±X directions, a deformation based on the Poisson's ratio occurs even in the ±Y directions in the pattern region 121a, in addition to a deformation in the ±X directions. Thus, the shape C1 of the pattern region 121a becomes not the trapezoidal shape, but a shape C2 represented by a broken line in 42 of FIG. 4B. The control unit 107 sets, as a target shape A2, the shape C2 of the pattern region 121a deformed by the deformation unit 124. Then, the control unit 107 controls heating of the substrate 111 by the heating unit 132 so that the shape A1 of the first shot region 108a comes close to the target shape A2. For example, the control unit 107 controls the heating unit 132 to irradiate the substrate 111 with light so that the thermal dose distribution of the first shot region 108a becomes a distribution in which the thermal dose is uniform in the X direction, and as for the Y direction, linearly decreases in the −Y direction. At this time, the substrate 111 isotropically expands in accordance with the temperature, and the first shot region 108a is deformed in accordance with the temperature not only in the ±X directions but also in the ±Y directions. As a result, the shape A1 of the first shot region 108a can come close to the shape C2 (target shape A2) of the pattern region 121a deformed by the deformation unit 124. That is, the first shot region 108a on the substrate and the pattern region 121a on the mold can be aligned at high accuracy. The thermal dose to be applied to the substrate 111 in order to deform the shot region 108 can be determined in accordance with the size and dimensions of the initial shape of the shot region 108.

Next, alignment between the shot region 108 and the pattern region 121a when performing the imprint process successively in the first shot region 108a (first region) and a second shot region 108b (second region) adjacent to each other on the substrate will be explained with reference to FIGS. 5A to 6B. FIGS. 5A to 6B are views each showing the first shot region 108a and second shot region 108b adjacent to each other on the substrate. As described above, the initial shape of the first shot region 108a and that of the second shot region 108b are the trapezoidal shape A1 and a trapezoidal shape B1, respectively. For descriptive convenience, assume that the shape A1 of the first shot region 108a and the shape B1 of the second shot region 108b are identical with the same dimensions. However, the present invention is not limited to this, and the first shot region 108a and second shot region 108b may have different shapes and different dimensions.

Figure 5A:
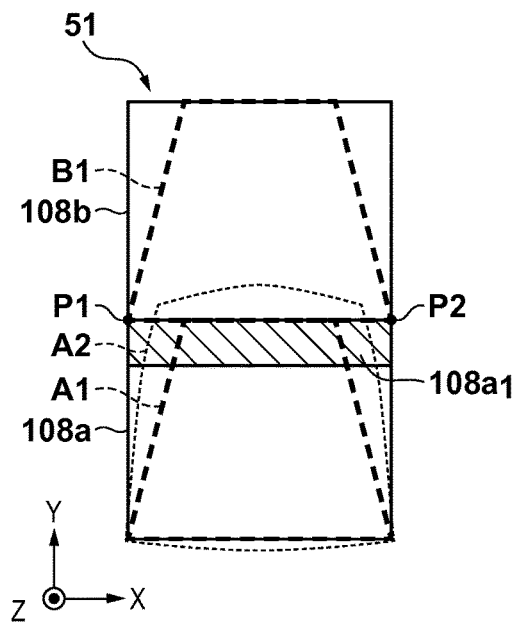
FIGS. 5A and 5B are views showing the first shot region and second shot region adjacent to each other on the substrate.
Figure 5B:
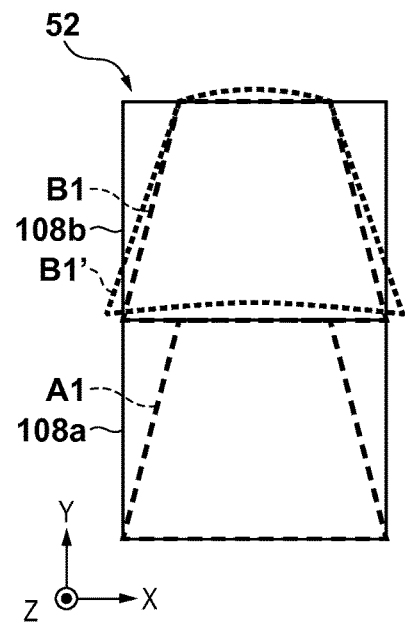

For example, a case will be examined, in which the imprint process of the first shot region 108a is performed first and then the imprint process of the second shot region 108b is performed (see FIGS. 5A and 5B). In this case, as shown in 51 of FIG. 5A, the control unit 107 controls heating of the substrate 111 by the heating unit 132 so that the shape A1 of the first shot region 108a comes close to the target shape A2 at the time of alignment between the first shot region 108a and the pattern region 121a of the mold 121. After the end of the imprint process of the first shot region 108a, the control unit 107 starts alignment between the second shot region 108b and the pattern region 121a of the mold 121. At this time, heat generated when the heating unit 132 heated the substrate 111 to bring the shape A1 of the first shot region 108a close to the target shape A2 remains in the substrate 111. Owing to the influence of this heat, the shape B1 of the second shot region 108b changes to a shape B1' shown in 52 of FIG. 5B. That is, the trapezoid component of the second shot region 108b increases, widening differences from the upper and lower sides of the shape B1 before deforming the second shot region 108b by the heating unit 132. If the shape B1 of the second shot region 108b changes to the shape B1' under the influence of deformation of the first shot region 108a, the thermal dose when heating the substrate 111 by the heating unit 132 to bring the shape of the second shot region 108b close to a target shape B2 may increase. If the thermal dose increases, it becomes necessary to prolong the time for heating the substrate 111 by the heating unit 132, or increase the output of the light source of the heating unit 132. This may lead to an increase in apparatus cost or a decrease in throughput.

Figure 6A:
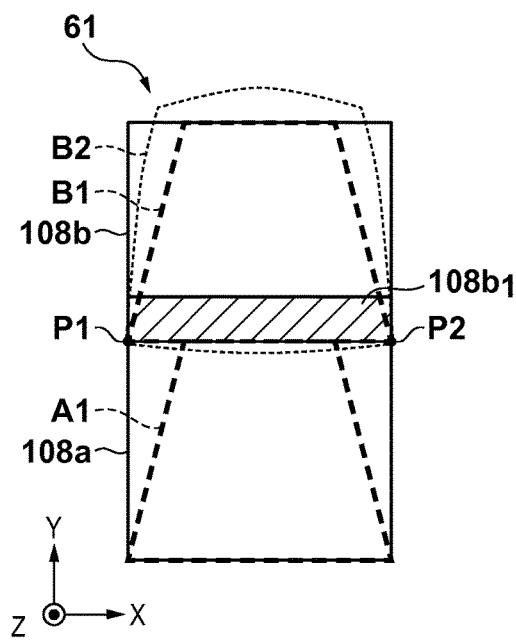
FIGS. 6A and 6B are views showing the first shot region and second shot region adjacent to each other on the substrate.
Figure 6B:
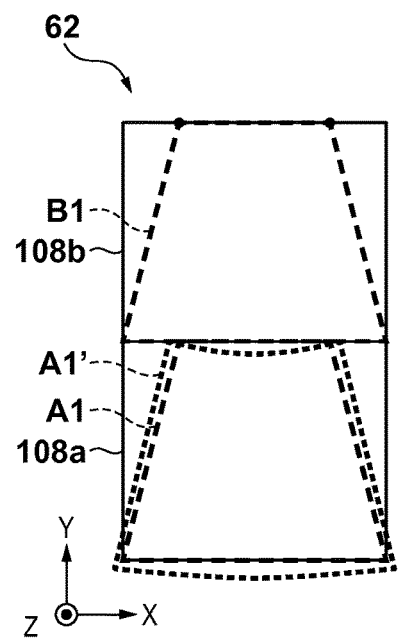

In contrast, a case will be examined, in which the imprint process of the second shot region 108b is performed first and then the imprint process of the first shot region 108a is performed (see FIGS. 6A and 6B). In this case, as shown in 61 of FIG. 6A, the control unit 107 controls heating of the substrate 111 by the heating unit 132 so that the shape B1 of the second shot region 108b comes close to the target shape B2 at the time of alignment between the second shot region 108b and the pattern region 121a of the mold 121. After the end of the imprint process of the second shot region 108b, the control unit 107 starts alignment between the first shot region 108a and the pattern region 121a of the mold 121. At this time, heat generated when the heating unit 132 heated the substrate 111 to bring the shape B1 of the second shot region 108b close to the target shape B2 remains in the substrate 111. Owing to the influence of this heat, the shape A1 of the first shot region 108a changes to a shape A1' shown in 62 of FIG. 6B.

However, the influence on the first shot region 108a upon performing first the imprint process of the second shot region 108b is smaller than the influence on the second shot region 108b upon performing first the imprint process of the first shot region 108a. This is because the difference between a portion $108a_1$ on the second shot region side in the first shot region 108a, and a corresponding target shape is smaller than the difference between a portion $108b_1$ on the first shot region side in the second shot region 108b, and a corresponding target shape. That is, a thermal dose to be applied to the portion $108a_1$ of the first shot region 108a is smaller than a thermal dose to be applied to the portion $108b_1$ of the second shot region 108b. For this reason, a thermal dose to be applied to the shot region 108 to be imprinted subsequently can be smaller by performing first the imprint process of the second shot region 108b, as shown in FIGS. 6A and 6B, than by performing first the imprint process of the first shot region 108a, as shown in FIGS. 5A and 5B. That is, in the imprint apparatus 100, the order in which the imprint process is performed in the first shot region 108a and second shot region 108b may be so determined as to decrease thermal doses to be applied to the first shot region 108a and second shot region 108b.

The imprint apparatus 100 (processing unit 109) according to the first embodiment determines one of the first shot region 108a and second shot region 108b as the shot region 108 to be imprinted first. Then, the imprint apparatus 100 determines the other one of the first shot region 108a and second shot region 108b as the shot region 108 to be imprinted. At this time, the influence on the other shot region upon deforming one shot region by the heating unit 132 so as to come close to a target shape is smaller than the influence on one shot region upon deforming the other shot region by the heating unit so as to come close to a target shape. In this fashion, the order in which the imprint process is performed is determined. An increase in a thermal dose to be applied to the target shot region 108 to be imprinted under the influence of a shot region previously having been imprinted can be suppressed.

Figures 7A, 7B:
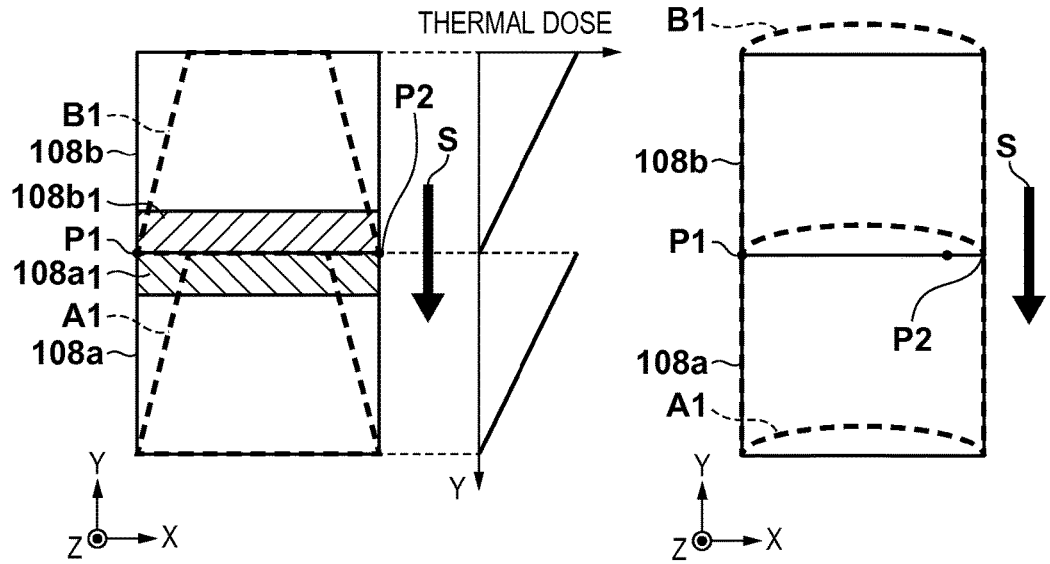
FIGS. 7A and 7B are views showing the first shot region and second shot region adjacent to each other on the substrate.

One method of determining the order in which the imprint process is performed is a method of determining the order based on shape information of each shot region 108 that has been obtained in step S103 of FIG. 2. For example, as shown in FIG. 7A, the processing unit 109 compares the shape difference between the portion $108a_1$ of the first shot region 108a and a corresponding target shape, with the shape difference between the portion $108b_1$ of the second shot region 108b and a corresponding target shape. The processing unit 109 determines, as the shot region 108 to be imprinted first, the shot region 108 having a smaller shape difference out of the first shot region 108a and the second shot region 108b. In the example shown in FIG. 7A, the shape difference at the portion $108b_1$ of the second shot region 108b is smaller than the shape difference at the portion $108a_1$ of the first shot region 108a. Thus, the processing unit 109 determines the second shot region 108b as the shot region 108 to be imprinted first. That is, when a deformation including a trapezoid component has occurred in each shot region 108, as shown in FIG. 7A, an order complying with a direction (arrow S in FIG. 7A) from the short side to the long side, out of the upper and lower sides of the trapezoidal shape is determined as the order of the shot regions 108 to be imprinted. That is, based on an index representing the type or orientation of a deformation component included in each shot region 108, the processing unit 109 may determine the order in which the imprint process is performed.

Alternatively, for example, based on the deformation amount of a side of each shot region 108 on the boundary line (line P1-P2) between the first shot region 108a and the second shot region 108b, the processing unit 109 may determine the order in which the imprint process is performed, as shown in FIG. 7A. The processing unit 109 compares the difference (deformation amount) between a side of the first shot region 108a on the line P1-P2 and a corresponding side of a target shape, with the difference (deformation amount) between a side of the second shot region 108b on the line P1-P2 and a corresponding side of a target shape. The processing unit 109 determines, as a shot region to be imprinted first, the shot region 108 having a smaller deformation amount out of the first shot region 108a and the second shot region 108b. In the example shown in FIG. 7A, the deformation amount of a side on the line P1-P2 is smaller for the second shot region 108b than the first shot region 108a. Thus, the processing unit 109 determines the second shot region 108b as the shot region 108 to be imprinted first.

Further, another method of determining the order in which the imprint process is performed is a method of determining the order based on a heating distribution to be applied to each shot region 108 formed on the substrate. For example, based on shape information of each shot region 108 that has been obtained in step S103 of FIG. 2, the processing unit 109 determines a heating distribution to be applied to each shot region. An example of the determined heating distribution is shown on the right side of FIG. 7A. Then, the processing unit 109 compares a thermal dose to be applied to the portion 108a₁ of the first shot region 108a, with a thermal dose to be applied to the portion 108b₁ of the second shot region 108b. The processing unit 109 determines the shot region 108 having a smaller thermal dose as a shot region to be imprinted first.

In the above-described example, a deformation including a trapezoid component has occurred in each shot region 108. However, the present invention is not limited to this. For example, when a deformation including an arcuate component has occurred in each shot region 108, as shown in FIG. 7B, the order in which the imprint process is performed may be determined based on the shape information or heating distribution. In the example shown in FIG. 7B, the imprint process is desirably performed in the two shot regions 108a and 108b in an order complying with the direction of the arrow S. That is, the heating unit 132 heats first the second shot region 108b. This can reduce a thermal dose to be applied to the substrate 111 in order to correct sides of the first shot region 108a and second shot region 108b on the boundary line (line P1-P2). When a deformation including a combination of a trapezoid component and arcuate component has occurred in each shot region 108, the order may be de determined by setting an evaluation function. For example, a trapezoidal shape coefficient in which the orientation of the trapezoidal shape shown in FIG. 7A is defined as "+", and an arcuate shape coefficient in which the orientation of the arcuate shape shown in FIG. 7B is defined as "+" are prepared. A value obtained by multiplying the amount of a trapezoid component by the trapezoidal shape coefficient, and a value obtained by multiplying the amount of an arcuate component by the arcuate shape coefficient are added. The order is determined based on the sign (positive/negative) of the sum.

As described above, the imprint apparatus 100 according to the first embodiment determines the order in which the imprint process is performed in the plurality of shot regions 108, so as to decrease a thermal dose to be applied to each shot region 108. For example, the imprint apparatus 100 determines, as the shot region 108 to be imprinted, one of the first shot region 108a and second shot region 108b adjacent to each other, and determines the other shot region as the shot region 108 to be imprinted subsequently. The influence on the other shot region upon deforming one shot region by the heating unit 132 so as to come close to a target shape is smaller than the influence on one shot region upon deforming the other shot region by the heating unit 132 so as to come close to a target shape. In this fashion, the order in which the imprint process is performed is determined. An increase in a thermal dose to be applied to each shot region 108 formed on the substrate owing to the influence of heat remaining in the substrate 111 can be suppressed. The first embodiment has exemplified the plurality of shot regions 108 adjacent to each other. However, the present invention is applicable to even a case in which the order in which the imprint process is performed is determined for the plurality of shot regions 108 not adjacent to each other.

<Second Embodiment>

An imprint apparatus according to the second embodiment will be explained. The imprint apparatus 100 according to the first embodiment compares shape differences, thermal doses, or the like in the plurality of shot regions 108 to determine the order in which the imprint process is performed in the shot regions 108. To the contrary, the imprint apparatus according to the second embodiment sequentially determines, based on the heating distribution of a target shot region 108 (target shot region 108d (first region)) to be imprinted, the shot regions 108 each to be imprinted next to the shot region 108. The imprint apparatus according to the second embodiment has the same apparatus arrangement as that of the imprint apparatus 100 according to the first embodiment, and a description of the apparatus arrangement will not be repeated.

Figure 8:
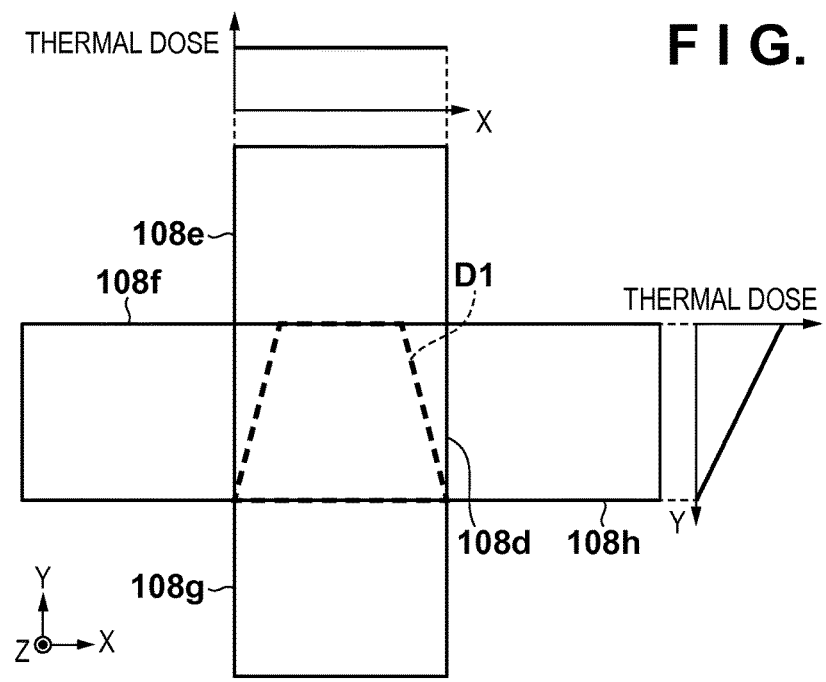
FIG. 8 is a view showing the arrangement of the first shot region and a plurality of shot regions adjacent to the first shot region.

For example, assume that a deformation including a trapezoid component has occurred in the target shot region 108d to be imprinted, and the initial shape of the target shot region 108d is a trapezoidal shape D1 in which a side (upper side) in the Y direction is shorter than a side (lower side) in the −Y direction, as shown in FIG. 8. At this time, the heating distribution when a heating unit 132 heats the target shot region 108d is a distribution in which the thermal dose is constant in the X direction, and as for the Y direction, linearly decreases in the −Y direction, as represented on the upper side and right side of FIG. 8. When the target shot region 108d is heated in accordance with this heating distribution, the deformation amount of the lower side of the target shot region 108d becomes smaller than that of the upper side. That is, the influence of deforming the target shot region 108d is smaller in the shot region 108g arranged beside the lower side of the target shot region 108d, than in the shot region 108e arranged beside the upper side, out of a plurality of shot regions 108e to 108h adjacent to the target shot region 108d. From this, a processing unit 109 determines, based on the heating distribution of the target shot region 108d, the shot region 108g on which the influence of deforming the target shot region 108d by the heating unit 132 is smallest, out of the plurality of shot regions 108e to 108h adjacent to the target shot region 108d. The processing unit 109 determines the determined shot region 108g as the shot region 108 (second region) to be imprinted next to the target shot region 108d. In FIG. 8, the shot region 108 to be imprinted next to the target shot region 108d is determined from the plurality of shot regions 108e to 108h adjacent to the target shot region 108d in the X and Y directions. However, the present invention is not limited to this. For example, the shot region 108 diagonally adjacent to the target shot region 108d may be determined as the shot region 108 to be imprinted next to the target shot region 108d.

As described above, the imprint apparatus according to the second embodiment determines, based on the heating distribution when heating the target shot region 108d, the shot region 108 to be imprinted next to the target shot region 108d to be imprinted. In this manner, the shot region 108 to be imprinted next to the target shot region 108d is determined. An increase in a thermal dose to be applied to each shot region 108 formed on the substrate under the influence of heat remaining in a substrate 111 can be suppressed.

<Third Embodiment>

Figure 9:
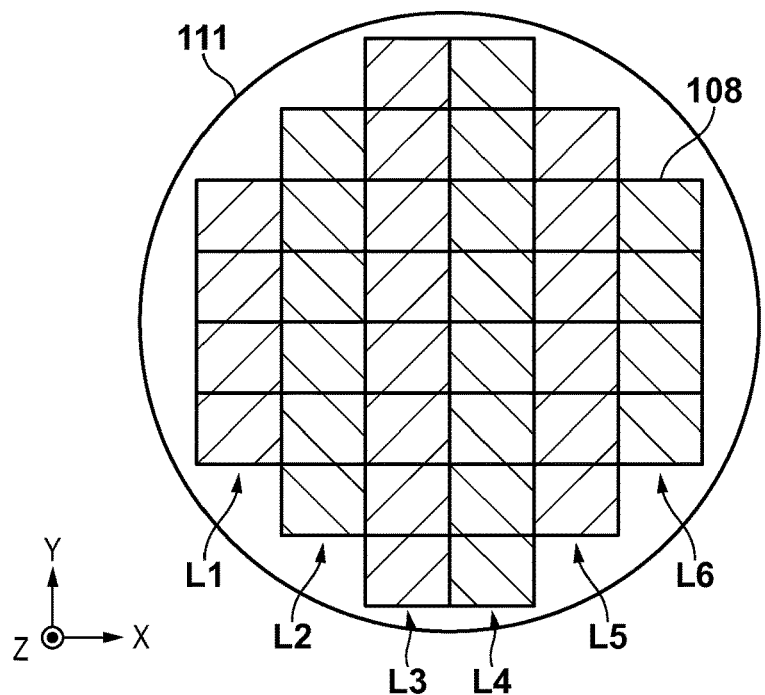
FIG. 9 is a view showing the arrangement of a plurality of shot regions formed on a substrate.

An imprint apparatus according to the third embodiment will be described. The third embodiment will explain a method of determining, for each shot region array including at least two shot regions 108, the order in which the imprint process is performed. FIG. 9 is a view showing the arrangement of the plurality of shot regions 108 on a substrate. As shown in FIG. 9, the plurality of shot regions 108 formed on the substrate are assigned to a plurality of shot region arrays L1 to L6 each including at least two shot regions 108 arrayed in the Y direction (first direction). As for the respective shot region arrays L1 to L6, the imprint apparatus according to the third embodiment determines, as the order of the shot regions 108 to be imprinted, one of an order complying with the first direction (Y direction), and an order complying with the second direction (−Y direction) opposite to the first direction. A method of determining the order of the shot regions 108 to be imprinted in the respective shot region arrays L1 to L6 will be explained below.

Figure 10:
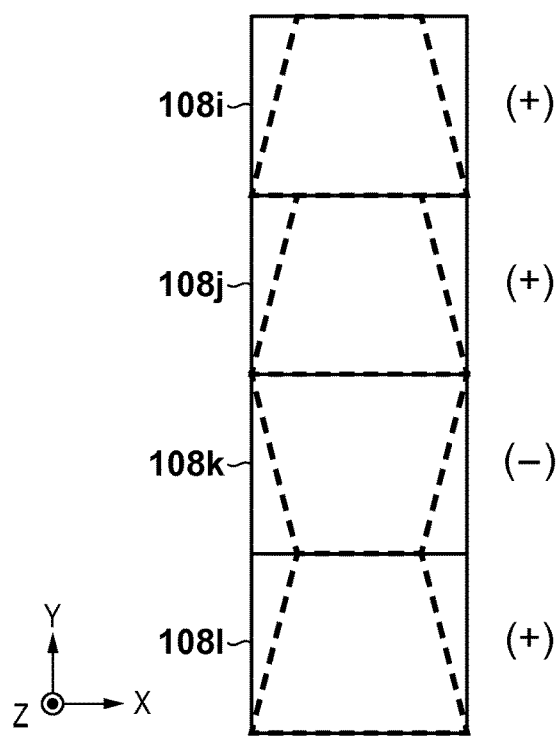
FIG. 10 is a view showing the arrangement of a plurality of shot regions included in a shot region array L1.

One method of determining, for each shot region array, the order of the shot regions 108 to be imprinted is a method of evaluating each shot region 108 based on an evaluation function representing the index of the shape or orientation of the shot region 108, and determining the order based on the evaluation result. For example, a case will be examined, in which the order in which the imprint process is performed in four shot regions 108i to 108l included in the shot region array L1 is determined. Assume that a deformation including a trapezoid component has occurred in the respective shot regions 108i to 108l included in the shot region array L1, as shown in FIG. 10. At this time, when the index of the orientation of the target shape shown in FIG. 7A is defined as "+", the indices of orientations (shapes) in the shot regions 108i, 108j, and 108l are "+", and the index of an orientation (shape) in the shot region 108k is "−". A value obtained by adding the indices of the orientations in the four shot regions 108i to 108l becomes "+". Thus, a processing unit 109 determines an order complying with the −Y direction (second direction) as the order in which the imprint process is performed in the four shot regions 108i to 108l of the shot region array L1. Similarly, as for the remaining shot region arrays L2 to L6, orientations (shapes) in respective shot regions are evaluated based on the evaluation function, and orders in which the imprint process is performed in the respective shot region arrays L2 to L6 are determined based on the evaluation results.

In the third embodiment, the order in which the imprint process is performed is determined based on the evaluation function representing the index of the orientation (shape) of the shot region 108. However, when the order in which the imprint process is performed has a constraint different from the orientation (shape) of the shot region 108, an evaluation function complying with the constraint may be applied as needed. When a shot region array includes the shot region 108 in which a thermal dose to be applied by a heating unit 132 exceeds a threshold, the order in the shot region array may be changed to finally deform the shot region 108 by the heating unit 132. For example, when a thermal dose to be applied to the shot region 108k of the shot region array L1 shown in FIG. 10 exceeds a threshold, the order in the shot region array L1 may be changed to perform the imprint process of the shot region 108k after the shot regions 108i, 108j, and 108l.

As described above, the imprint apparatus according to the third embodiment determines, for each shot region array including at least the two shot regions 108, the order in which the imprint process is performed. When determining, for each shot region array, the order in which the imprint process is performed, the imprint apparatus evaluates each shot region 108 in each shot region array by using the evaluation function representing the index of the shape or orientation of the shot region 108, and determines the order based on the evaluation result. In this way, the order in which the imprint process is performed is determined for each shot region array. While suppressing a decrease in the productivity (throughput) of the imprint apparatus, an increase in a thermal dose to be applied to each shot region 108 under the influence of heat remaining in a substrate 111 can be suppressed.

<Fourth Embodiment>

An imprint apparatus 400 according to the fourth embodiment of the present invention will be described with reference to FIG. 11. The imprint apparatus 400 shapes an imprint material in a shot region formed on the upper surface (first surface) of a substrate 410 by using a mold 408 having a pattern region 408a in which a pattern is formed, thereby forming the pattern in the shot region. For example, the imprint apparatus 400 is used to manufacture a semiconductor device or the like. The imprint apparatus 400 cures the imprint material on the substrate while the mold 408 in which a pattern is formed is in contact with the imprint material. Then, the imprint apparatus 400 widens the interval between the substrate 410 and the mold 408 to separate (release) the mold 408 from the cured imprint material. As a result, the imprint apparatus 400 can transfer the pattern of the mold 408 onto the substrate. The imprint apparatus 400 according to the fourth embodiment adopts the photo-curing method.

FIG. 11 is a schematic view showing the arrangement of the imprint apparatus 400 according to the fourth embodiment. The imprint apparatus 400 includes a mold holding unit 403, substrate holding unit 404, exposure unit 402, resin supply unit 405, and alignment measurement unit 406 (measurement unit). The imprint apparatus 400 also includes a control unit 407 which controls the imprint process (controls each unit of the imprint apparatus 400). The control unit 407 is constituted by a computer including a CPU and memory, is connected to each unit of the imprint apparatus 400 via a line, and can control each unit in accordance with a program or the like. The control unit 407 may be constituted integrally with the remaining portions of the imprint apparatus 400 (may be arranged in a common housing), or constituted separately from the remaining portions (may be arranged in another housing). The mold holding unit 403 is fixed to a bridge plate 428 supported by a base plate 427 via an antivibrator 429 and column 430. The substrate holding unit 404 is fixed to the base plate 427. The antivibrator 429 suppresses vibrations transmitted to the bridge plate 428 from a floor on which the imprint apparatus 400 is installed.

At the time of the imprint process, the exposure unit 402 irradiates a resin 414 on the substrate with light 409 (ultraviolet rays) for curing the resin 414. The exposure unit 402 can include a light source which emits light (ultraviolet rays) for curing the resin 414 on the substrate, and an optical system which shapes light emitted by the light source into light appropriate for the imprint process. In the imprint apparatus 400 according to the fourth embodiment, the light 409 emitted by the exposure unit 402 is reflected by an optical member 436 and irradiates the resin 414 on the substrate so as not to block the optical path of light 435 emitted by the alignment measurement unit 406 (to be described later). The imprint apparatus 400 according to the fourth embodiment is configured so that the light 409 emitted by the exposure unit 402 is reflected by the optical member 436 and irradiates the substrate 410, and the light 435 traveling from the alignment measurement unit 406 passes through the optical member 436 and irradiates the substrate 410. However, the present invention is not limited to this. For example, the imprint apparatus 400 may be configured so that the light 409 emitted by the exposure unit 402 passes through the optical member 436 and irradiates the substrate 410, and the light 435 traveling from the alignment measurement unit 406 is reflected by the optical member 436 and irradiates the substrate 410. As the optical member 436, for example, a dichroic mirror having a characteristic in which the mirror transmits light having a specific wavelength and reflects light having a wavelength different from the specific wavelength can be used.

The mold 408 is generally made of a material, such as quartz, capable of transmitting ultraviolet rays. A projection-and-recess pattern to be transferred to the substrate 410 is formed in a partial region (pattern region 408a) on the substrate-side surface of the mold 408. The mold 408 may be configured to form a cavity (concave portion) in a surface of the mold 408 opposite to the substrate-side surface so that the thickness is decreased near the pattern region 408a. Since the cavity is formed to decrease the thickness near the pattern region, the pattern region 408a can be deformed into a convex shape toward the substrate 410 when the pressure of an opening region 413 (to be described later) is increased.

The mold holding unit 403 can include a mold chuck 411 which holds the mold 408 by a vacuum chucking force, electrostatic chucking force, or the like, and a mold driving unit 412 which drives the mold chuck 411 in the Z direction. The mold driving unit 412 has the opening region 413 at its central portion (inside) so that light emitted by the exposure unit 402 irradiates the substrate 410 via the mold 408. A light transmitting member (for example, a glass plate (not shown)) may be arranged in the opening region 413 so that a space defined by part of the opening region 413 and the cavity formed in the mold 408 become an enclosed space. When the light transmitting member is arranged in this way, a pressure regulation device (not shown) is connected via a pipe to the space enclosed by the light transmitting member, and regulates a pressure in the space. For example, when bringing the mold 408 and the resin 414 on the substrate into contact with each other, the pressure regulation device sets a pressure in the space to be higher than an external pressure, and deforms the pattern region 408a of the mold 408 into a convex shape toward the substrate 410. Since the pattern region 408a can come into contact with the resin 414 on the substrate outward from the central portion of the pattern region 408a, this can reduce air bubbles trapped in the pattern of the mold 408. As a result, loss of the pattern transferred onto the substrate can be prevented.

In some cases, a deformation including a component such as a magnification component, trapezoid component, or parallelogram component has occurred in the pattern region 408a of the mold 408 owing to a manufacturing error, heat deformation, or the like. Hence, the mold holding unit 403 may include a deformation unit 438 which deforms the pattern region 408a by applying forces to a plurality of portions on the side surface of the mold 408. For example, the deformation unit 438 can include a plurality of actuators 439 so arranged as to apply forces to the respective side surfaces of the mold 408, as shown in FIG. 12. The plurality of actuators 439 arranged on the respective side surfaces of the mold 408 individually apply forces to a plurality of portions on the respective side surfaces. The deformation unit 438 can therefore deform the pattern region 408a of the mold 408. As the actuator 439 in the deformation unit 438, for example, a linear motor, air cylinder, or piezoelectric actuator is usable. At least one of the deformation amount, distortion amount, and applied force is monitored. Based on the monitoring result, the control unit 407 controls the plurality of actuators 439 in the deformation unit 438.

The mold driving unit 412 includes, for example, an actuator such as a linear motor or air cylinder, and drives the mold chuck 411 (mold 408) in the Z direction to bring the mold 408 and the resin 414 on the substrate into contact with each other or separate them from each other. Since the mold driving unit 412 needs to perform high-accuracy positioning when bringing the mold 408 and the resin 414 on the substrate into contact with each other, it may be constituted by a plurality of driving systems such as a coarse driving system and fine driving system. In addition to the function of driving in the Z direction, the mold driving unit 412 may have a position adjustment function of adjusting the position of the mold 408 in the X and Y directions and the ωZ direction (rotational direction about the Z-axis), a tilt function of correcting the tilt of the mold 408, and the like. In the imprint apparatus 400 according to the fourth embodiment, the mold driving unit 412 performs an operation of changing the distance between the mold 408 and the substrate 410. Alternatively, a substrate driving unit 417 of the substrate holding unit 404 may perform this operation, or both of the mold driving unit 412 and substrate driving unit 417 may relatively perform it.

As the substrate 410, for example, a single-crystal silicon substrate, SOI (Silicon on Insulator) substrate, or the like is used. The resin supply unit 405 (to be described later) supplies a resin (ultraviolet-curing resin) to the upper surface (process target surface (first surface)) of the substrate 410.

The substrate holding unit 404 includes a substrate chuck 416 and the substrate driving unit 417, and drives the substrate 410 in the X and Y directions. The substrate chuck 416 holds the substrate 410 by chucking the lower surface (second surface opposite to the first surface) of the substrate 410 by a vacuum chucking force, electrostatic chucking force, or the like. The substrate driving unit 417 mechanically holds the substrate chuck 416, and drives the substrate chuck 416 (substrate 410) in the X and Y directions. As the substrate driving unit 417, for example, a linear motor or planar motor may be used. The substrate driving unit 417 may be constituted by a plurality of driving systems such as a coarse driving system and fine driving system. Also, the substrate driving unit 417 may have a driving function of driving the substrate 410 in the Z direction, a position adjustment function of driving the substrate 410 to rotate in the ωZ direction, and adjusting the position of the substrate 410, a tilt function of correcting the tilt of the substrate 410, and the like.

A position measurement unit 419 measures the position of the substrate holding unit 404. The position measurement unit 419 includes, for example, a laser interferometer and encoder, and measures the position of the substrate holding unit 404. An example in which the position measurement unit 419 includes a laser interferometer will be described. The laser interferometer emits a laser beam toward a reflecting plate 418 arranged on the side surface of the substrate holding unit 404 (substrate chuck 416), and detects a displacement from a reference position on the substrate holding unit 404 based on the laser beam reflected by the reflecting plate 418. Based on the displacement detected by the laser interferometer, the position measurement unit 419 can measure the current position of the substrate holding unit 404. Based on the result of measurement by the position measurement unit 419, the control unit 407 controls positioning of the substrate holding unit 404 (substrate 410). The position measurement unit 419 can include one or more laser interferometers for detecting displacements of the substrate holding unit 404 in the X, Y, and Z directions. In this case, the substrate holding unit 404 includes a plurality of reflecting plates 418 in correspondence with the respective laser interferometers. With this arrangement, the position measurement unit 419 can measure positions of the substrate holding unit 404 in the X direction, Y direction, Z direction, ωX direction (rotational direction about the X-axis), ωY direction (rotational direction about the Y-axis), and ωZ direction.

The resin supply unit 405 supplies an imprint material onto a substrate. As described above, in the fourth embodiment, an ultraviolet-curing resin (resin 414) having a property in which the resin is cured upon ultraviolet irradiation is used as the imprint material. The resin 414 to be supplied from the resin supply unit 405 onto the substrate can be appropriately selected under various conditions in semiconductor device manufacturing steps. The amount of resin supplied from the resin supply unit 405 can be appropriately determined in consideration of the thickness of a pattern to be formed on the resin 414 on the substrate, the density of the pattern, and the like. To sufficiently fill the pattern formed on the mold 408 with the resin 414 supplied on the substrate, the process may wait for the lapse of a predetermined time while the mold 408 and the resin 414 are in contact with each other.

The alignment measurement unit 406 measures the shape difference between the pattern region 408a and a shot region 420 by detecting a plurality of marks (alignment marks) respectively formed in the pattern region 408a of the mold 408 and the shot region 420 of the substrate 410. The marks of the pattern region 408a and the marks of the shot region 420 are arranged to overlap each other when the pattern region 408a and shot region 420 are made to coincide with each other in the X and Y directions. The alignment measurement unit 406 irradiates the marks of the pattern region 408a and corresponding marks of the shot region 420 with light via the optical member 436, and detects deviation amounts between them for the respective marks. Hence, the alignment measurement unit 406 can measure the shape difference between the pattern region 408a and the shot region 420.

In the imprint apparatus 400 having this arrangement, the substrate 410 to be imprinted is loaded into the imprint apparatus 400 after a heat process or the like in a series of semiconductor device manufacturing steps (for example, a deposition step such as sputtering). Hence, a deformation including a component such as a magnification component or trapezoid component may have occurred in the shot region 420 on the substrate. In this case, only by deforming the pattern region 408a of the mold 408 by the deformation unit 438, the pattern region 408a of the mold 408 and the shot region 420 of the substrate 410 may not be satisfactorily superposed. Therefore, the shot region 420 of the substrate 410 may be deformed so that the shot region 420 fits the shape of the pattern region 408a of the mold 408 deformed by the deformation unit 438. To achieve this, in the imprint apparatus 400 according to the fourth embodiment, the substrate holding unit 404 includes a heating unit 437 which irradiates the lower surface of the substrate 410 with light to heat the substrate 410 and deform the shot region 420. The arrangement of the substrate holding unit 404 including the heating unit 437 will be explained with reference to FIG. 12. FIG. 12 is a view showing the arrangement of the substrate holding unit 404 in the imprint apparatus 400 according to the fourth embodiment.

The heating unit 437 included in the substrate holding unit 404 irradiates a plurality of portions on the lower surface of the substrate 410 with light 421 to apply heat to the substrate 410 and deform the shot region 420. The heating unit 437 includes a plurality of light irradiating portions 422 each including an emitting element 422a which emits the light 421 to irradiate one portion on the lower surface of the substrate 410, and a cavity 422b which is formed between one portion and the emitting element 422a so that light for irradiating the lower surface of the substrate 410 passes through the cavity 422b. The emitting element 422a in each light irradiating portion 422 is configured so that the light 421 is obliquely incident on one portion on the lower surface of the substrate. The wavelength of the light 421 emitted by the emitting element 422a may be a wavelength which is absorbed by the substrate 410. For example, a wavelength in the region of ultraviolet light to visible light can be used. As the emitting element 422a, the heating unit 437 according to the fourth embodiment uses a light emitting element 440 such as a laser diode. A collimator lens 422c is arranged to efficiently guide the light 421 emitted by the emitting element 422a to the lower surface of the substrate 410. For example, as shown in FIG. 13, the plurality of light irradiating portions 422 are arranged in a matrix on the X-Y plane of the substrate holding unit 404 so that a deformation can be performed in each of the plurality of shot regions 420 formed on the substrate.

FIG. 13 is a view showing the substrate holding unit 404 when viewed from the Z direction. The arrangement and number of light irradiating portions 422 can be determined based on the deformation component of the shot region 420, the accuracy when deforming the shot region 420, and the like.

Figure 14A:
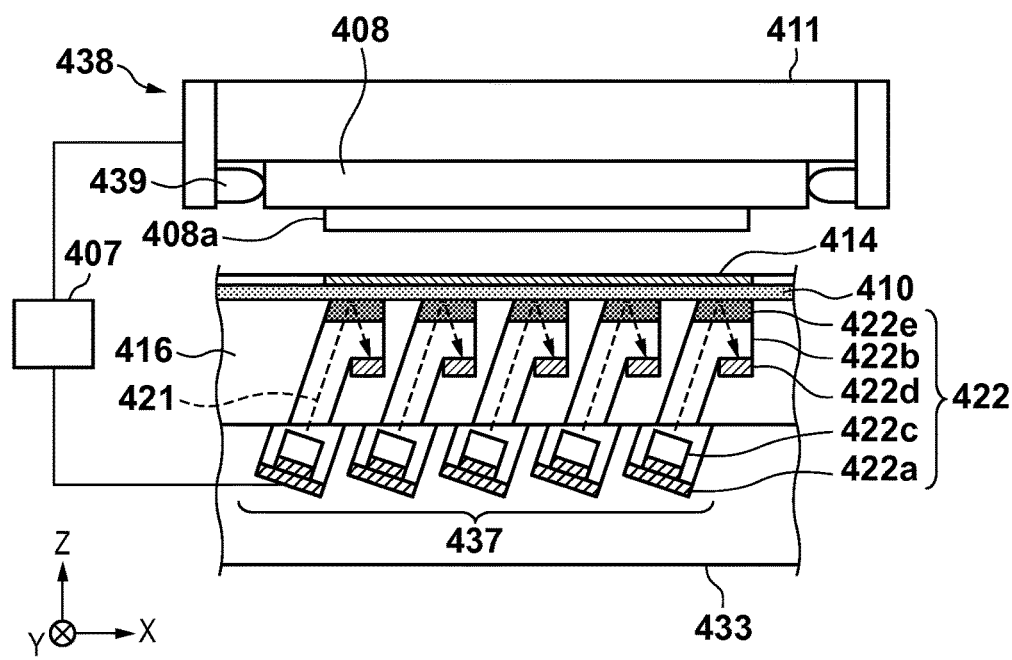
FIG. 14A is a view showing an example of the arrangement of the substrate holding unit.
Figure 14B:
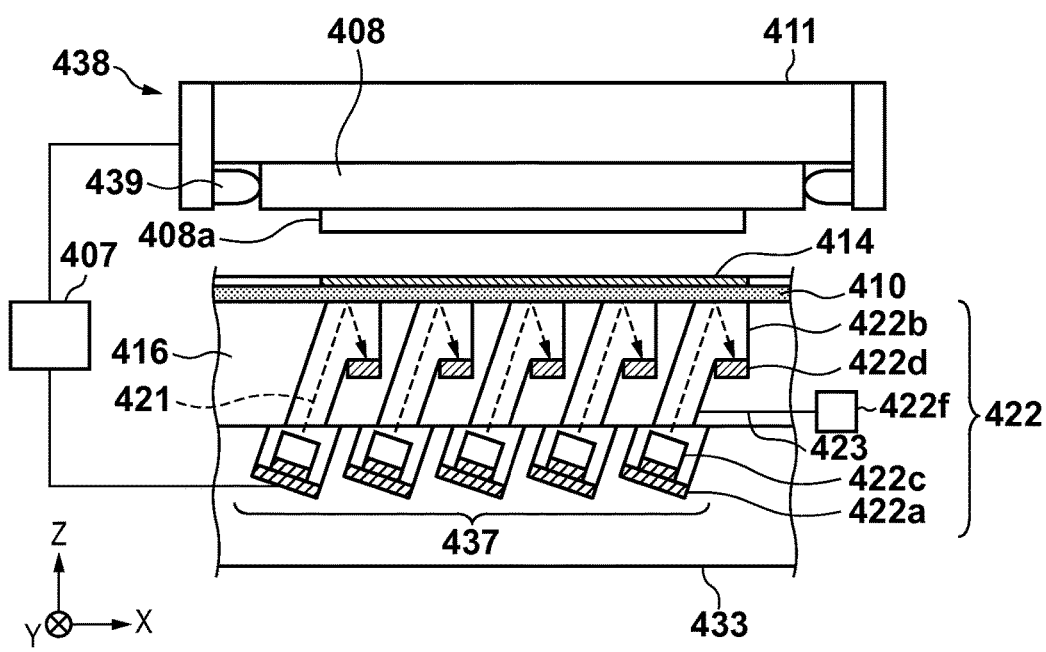
FIG. 14B is a view showing an example of the arrangement of the substrate holding unit.

Each light irradiating portion 422 may include a light absorbing member 422d for absorbing the light 421 which has been emitted by the emitting element 422a and reflected by the lower surface of the substrate 410. It can therefore be prevented to irradiate the substrate chuck 416 (inside the cavity 422b), the emitting element 422a, and the like with the light 421 reflected by the substrate 410, and to raise their temperatures. The light absorbing member 422d may be configured so that, for example, the absorptivity of the light 421 reflected by the lower surface of the substrate 410 becomes 80% or more. Also, in each light irradiating portion 422, the cavity 422b may contain a light transmitting member 422e (for example, a glass member) which transmits the light 421 emitted by the emitting element 422a, as shown in FIG. 14A. This can prevent entrance of a particle (foreign substance such as dust) into the cavity 422b when the substrate holding unit 404 does not hold the substrate 410. Further, each light irradiating portion 422 may include an adjustment portion 422f which adjusts a pressure in the cavity 422b via a pipe 423, as shown in FIG. 14B. By arranging the adjustment portion 422f, each light irradiating portion 422 can have a function of chucking a substrate. That is, when a pressure in the cavity 422b of each light irradiating portion 422 is adjusted while the substrate 410 is mounted on the substrate holding unit 404, the substrate 410 can be chucked and held by the plurality of light irradiating portions 422.

Figure 15:
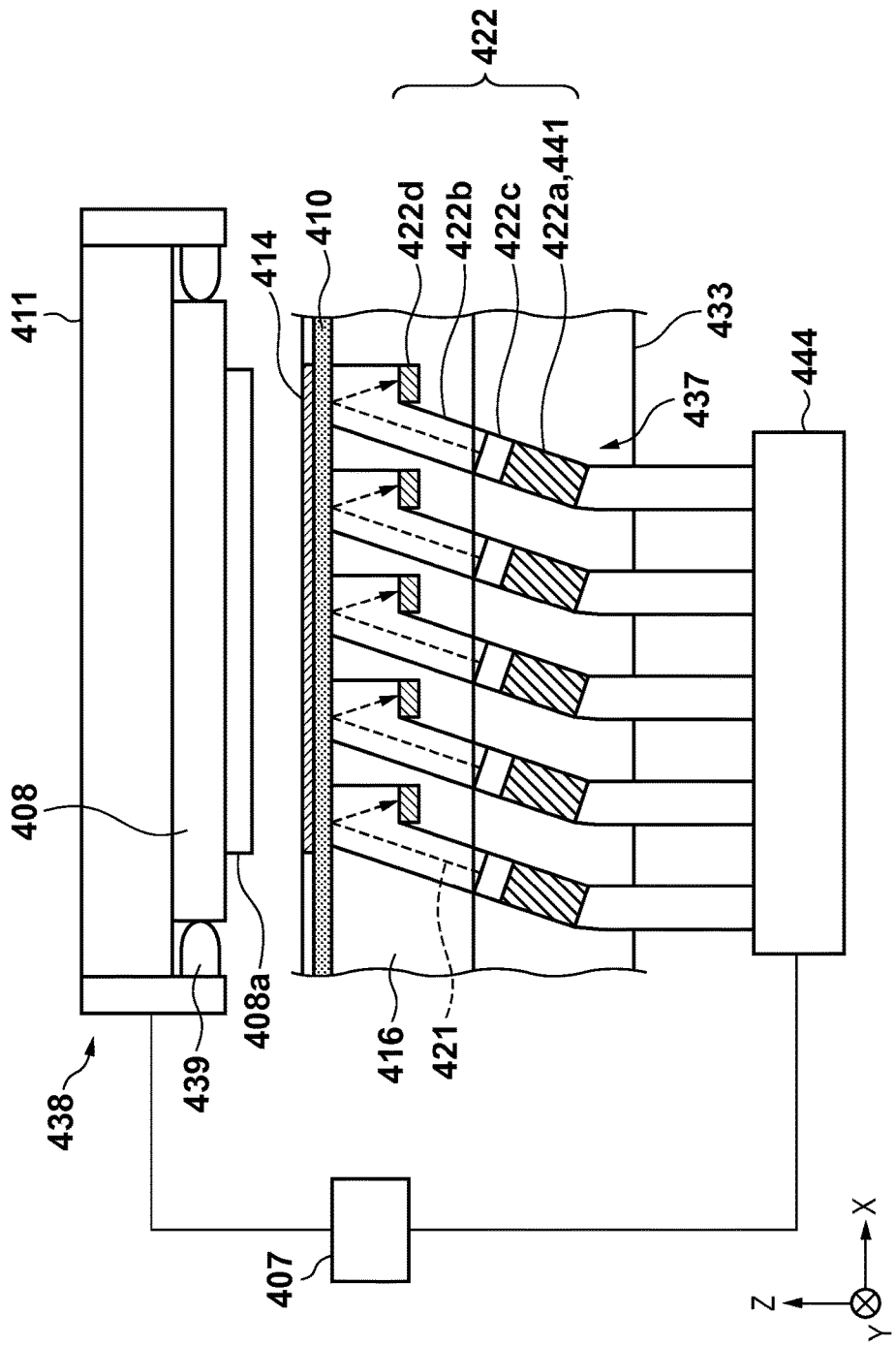
FIG. 15 is a view showing an example of the arrangement of the substrate holding unit.

As shown in FIGS. 11 and 12, the substrate holding unit 404 may be configured so that a temperature regulation plate 433 is interposed between the substrate chuck 416 and the substrate driving unit 417, and the emitting element 422a of each light irradiating portion 422 is arranged inside the temperature regulation plate 433. The temperature regulation plate 433 has, for example, a flow passage for supplying a refrigerant. By controlling the flow rate or temperature of the refrigerant, the temperature regulation plate 433 can manage the temperature of the substrate chuck 416 to a predetermined temperature, or absorb heat generated by the emitting element 422a and light absorbing member 422d. The heating unit 437 in the substrate holding unit 404 may use, as the emitting element 422a, an optical fiber 441 which guides light emitted by a light source 444 to one portion on the lower surface of the substrate 410, as shown in FIG. 15. Even in this case, the collimator lens 422c may be arranged to efficiently guide the light 421 emitted by the optical fiber 441 serving as the emitting element 422a to the lower surface of the substrate 410. The light source 444 may be configured to be able to individually change the intensity of light irradiating each portion on the lower surface of the substrate 410.

The substrate holding unit 404 may be configured to be able to change the chucking force for chucking each of a plurality of regions on the substrate 410. In the thus-configured substrate holding unit 404, a chucking force for chucking a region on the substrate including the shot region 420 is set to be smaller than a chucking force for chucking another region on the substrate at the time of alignment between the shot region 420 and the pattern region 408a of the mold 408. For example, assume that a plurality of regions on the substrate 410 include the first region having a target shot region 420a to be imprinted, and the second region different from the first region. At this time, the substrate holding unit 404 is controlled so that a chucking force in the first region becomes smaller than a chucking force in the second region when irradiating the lower surface of the substrate 410 with light to deform the shot region 420a at the time of alignment between the shot region 420a and the pattern region 408a. In this manner, a chucking force in each region on the substrate is controlled. While preventing the position deviation of the substrate 410, a frictional force generated between the lower surface of the shot region 420a and the substrate holding unit 404 can be reduced to increase the deformation amount of the shot region 420a with respect to the heat input amount to the substrate 410. As a result, the irradiation amount of light irradiating the substrate 410 to change the shape of the shot region 420a into a target shape can be decreased. The intensity of the light 421 emitted by the emitting element 422a can be decreased, and the time to irradiate the substrate 410 with the light 421 can be shortened.

In the example shown in FIG. 13, the substrate holding unit 404 is configured to be able to individually change the chucking force for chucking each of four regions 410a to 410d on the substrate 410. Assume that the region 410c includes the target shot region 420a to be imprinted. At the time of alignment between the shot region 420a and the pattern region 408a, the substrate holding unit 404 is controlled so that chucking forces in the region 410c including the shot region 420a and the adjacent region 410d become smaller than chucking forces in the regions 410a and 410b. While preventing the position deviation of the substrate 410, a frictional force generated between the lower surface of the shot region 420a and the substrate holding unit 404 can be reduced to efficiently deform the shot region 420a. The substrate holding unit 404 shown in FIG. 13 is configured to be able to individually change chucking forces in the four regions 410a to 410d divided in the X direction on the substrate. However, the present invention is not limited to this. For example, the number and shape of regions on the substrate can be appropriately set in an optimal combination for deforming the shot region 420. In accordance with this, the arrangement of the substrate holding unit 404 can also be appropriately changed.

Figure 16:
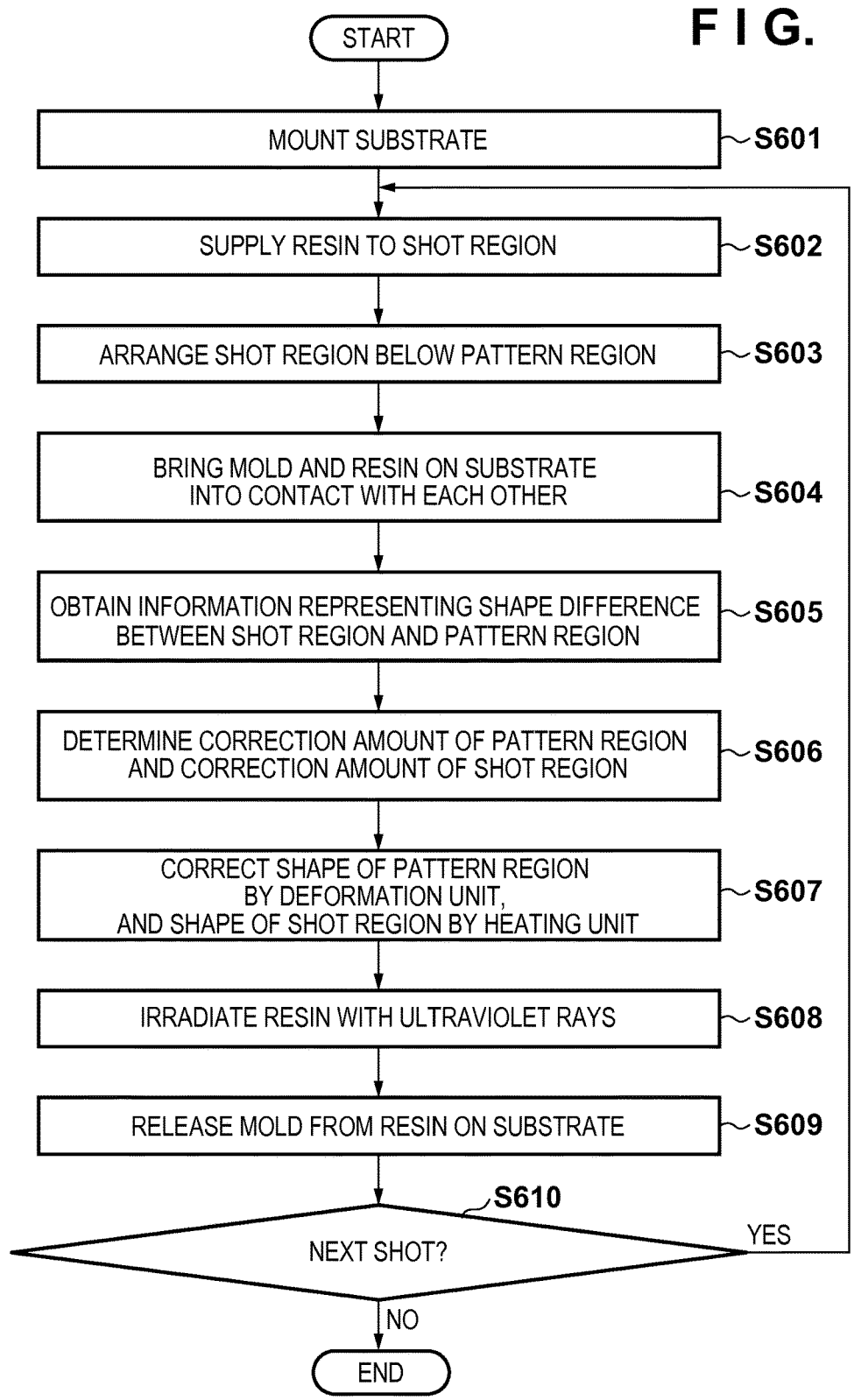
FIG. 16 is a flowchart showing an operation sequence in an imprint process.

An example of an imprint process of transferring the pattern of the mold 408 to each of the plurality of shot regions 420 on the substrate in the imprint apparatus 400 according to the fourth embodiment will be explained with reference to FIG. 16. FIG. 16 is a flowchart showing an operation sequence in the imprint process of transferring the pattern of the mold 408 to each of the plurality of shot regions 420 on the substrate.

In step S601, the control unit 407 controls a substrate transport mechanism (not shown) to transport the substrate 410 onto the substrate holding unit 404, and controls the substrate holding unit 404 to hold the substrate 410. Accordingly, the substrate 410 is arranged inside the imprint apparatus 400. In step S602, the control unit 407 controls the substrate driving unit 417 to arrange the shot region 420a (shot region 420 to be imprinted) on the substrate below the resin supply unit 405. The control unit 407 controls the resin supply unit 405 to supply the resin 414 (uncured resin) to the shot region 420a. In step S603, the control unit 407 controls the substrate driving unit 417 to arrange, below the pattern region 408a of the mold 408, the shot region 420a supplied with the resin 414. In step S604, the control unit 407 controls the mold driving unit 412 to bring the mold 408 and the resin 414 on the substrate into contact with each other. In step S605, the control unit 407 obtains information representing the shape difference between the pattern region 408a of the mold 408 and the shot region 420a on the substrate. The control unit 407 may obtain this information by measuring the shape difference between the pattern region 408a and the shot region 420a by the alignment measurement unit 406 arranged in the imprint apparatus 400. Alternatively, the control unit 407 may obtain, as this information, the shape difference between the pattern region 408a and the shot region 420a that has been obtained by a measurement device outside the imprint apparatus 400.

In step S606, based on the information obtained in step S605, the control unit 407 determines a correction amount in the pattern region 408a of the mold 408, and a correction amount in the shot region 420a of the substrate 410. In step S607, based on the correction amount in the pattern region 408a of the mold 408, the control unit 407 determines the driving amount (force to be applied to the mold by the deformation unit 438) of the deformation unit 438 when deforming the pattern region 408a by the deformation unit 438. Also, based on the correction amount in the shot region 420a of the substrate 410, the control unit 407 determines the intensity distribution of light irradiating the lower surface of the substrate 410 by the heating unit 437. Based on the driving amount and the intensity distribution of light that have been determined in step S607, the control unit 407 controls the deformation unit 438 and heating unit 437 to correct the shape of the pattern region 408a of the mold 408 and the shape of the shot region 420a of the substrate 410. That is, the control unit 407 aligns the pattern region 408a of the mold 408 and the shot region 420a of the substrate 410.

Figure 17A:
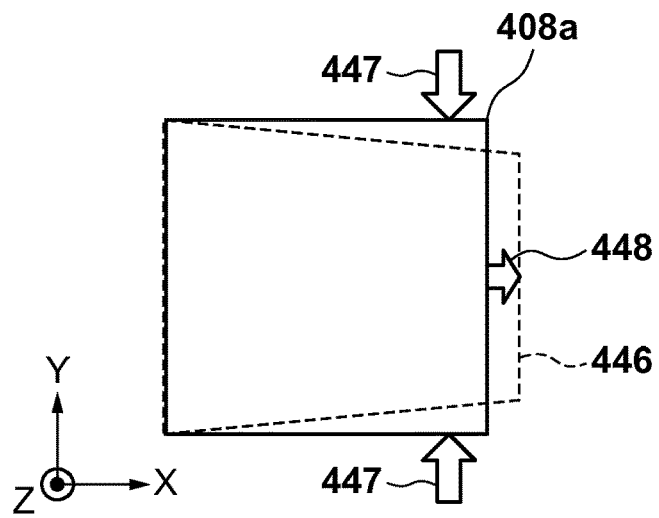
FIG. 17A is a view showing the shape of the pattern region of a mold.
Figure 17B:
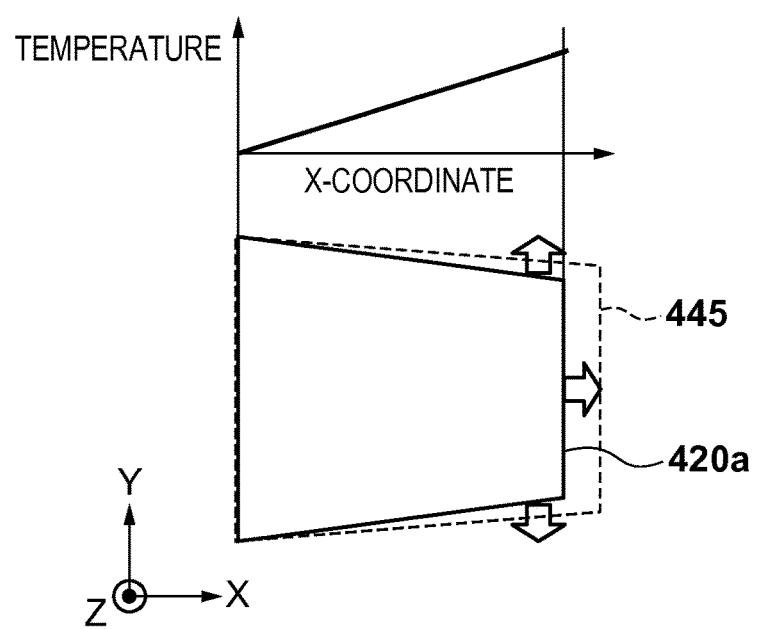
FIG. 17B is a view showing the shape of the shot region of a substrate.

Alignment between the pattern region 408a of the mold 408 and the shot region 420a of the substrate 410 will be explained with reference to FIGS. 17A and 17B. FIG. 17A is a view showing the shape of the pattern region 408a of the mold 408. FIG. 17B is a view showing the shape of the shot region 420a of the substrate 410. Assume that a deformation including a trapezoid component has occurred in the shot region 420a. First, the control unit 407 controls the deformation unit 438 to apply a force 447 to predetermined portions on the side surfaces of the mold 408 in the ±Y directions, thereby deforming the pattern region 408a so that the shape of the pattern region 408a comes close to the shape (trapezoidal shape) of the shot region 420a. At this time, a deformation 448 based on the Poisson's ratio may occur even in the +X direction, in addition to a deformation in the ±Y directions. Thus, the shape of the pattern region 408a becomes a shape 446 indicated by a broken line in FIG. 17A. If the pattern region 408a and shot region 420a are superposed at this stage, the superposition accuracy may drop by an amount corresponding to the deformation based on the Poisson's ratio. Therefore, the control unit 407 sets, as a target shape, the shape 446 of the pattern region 408a deformed by the deformation unit 438. Then, the control unit 407 controls heating of the substrate 410 by the heating unit 437 so that the shape of shot region 420a comes close to the target shape (shape 446).

For example, the control unit 407 controls the emitting element 422a of each light irradiating portion 422 in the heating unit 437 so that the temperature distribution of the shot region 420a becomes a distribution (upper view in FIG. 17B) in which the temperature is uniform in the Y direction and linearly increases in the +X direction. At this time, the substrate 410 isotropically expands in accordance with the temperature, and the shot region 420a is deformed not only in the ±Y directions but also in the ±X directions, and changes into a shape 445 indicated by a broken line in FIG. 17B. As a result, the shape of the shot region 420a can come close to the shape 446 (target shape) of the pattern region deformed by the deformation unit 438. That is, the pattern region 408a of the mold 408 and the shot region 420a of the substrate 410 can be aligned at high accuracy. In the example shown in FIGS. 17A and 17B, correction of a shot region in which a deformation including a trapezoid component has occurred has been explained. In practice, however, a deformation including various components (for example, a magnification component, trapezoid component, and parallelogram component) may have occurred in the shot region 420a. In this case, the emitting element 422a of each light irradiating portion 422 in the heating unit 437 may be controlled to form an appropriate temperature distribution in the X-Y plane of the shot region based on each component of the deformation generated in the shot region 420a.

In step S608, the control unit 407 controls the exposure unit 402 to irradiate, with ultraviolet rays, the resin 414 in contact with the mold 408, thereby curing the resin 414. To align the pattern region 408a of the mold 408 and the shot region 420a of the substrate 410 at high accuracy, the shape of the shot region deformed by the heating unit 437 may be maintained even in a period 451 in which the resin 414 is being cured. Hence, in the period 451 in which the resin 414 is being cured, the control unit 407 may adjust the intensity of light irradiating the lower surface of the substrate 410 by the heating unit 437 so as to maintain the shape of the shot region 420a deformed by the heating unit 437.

Figure 18:
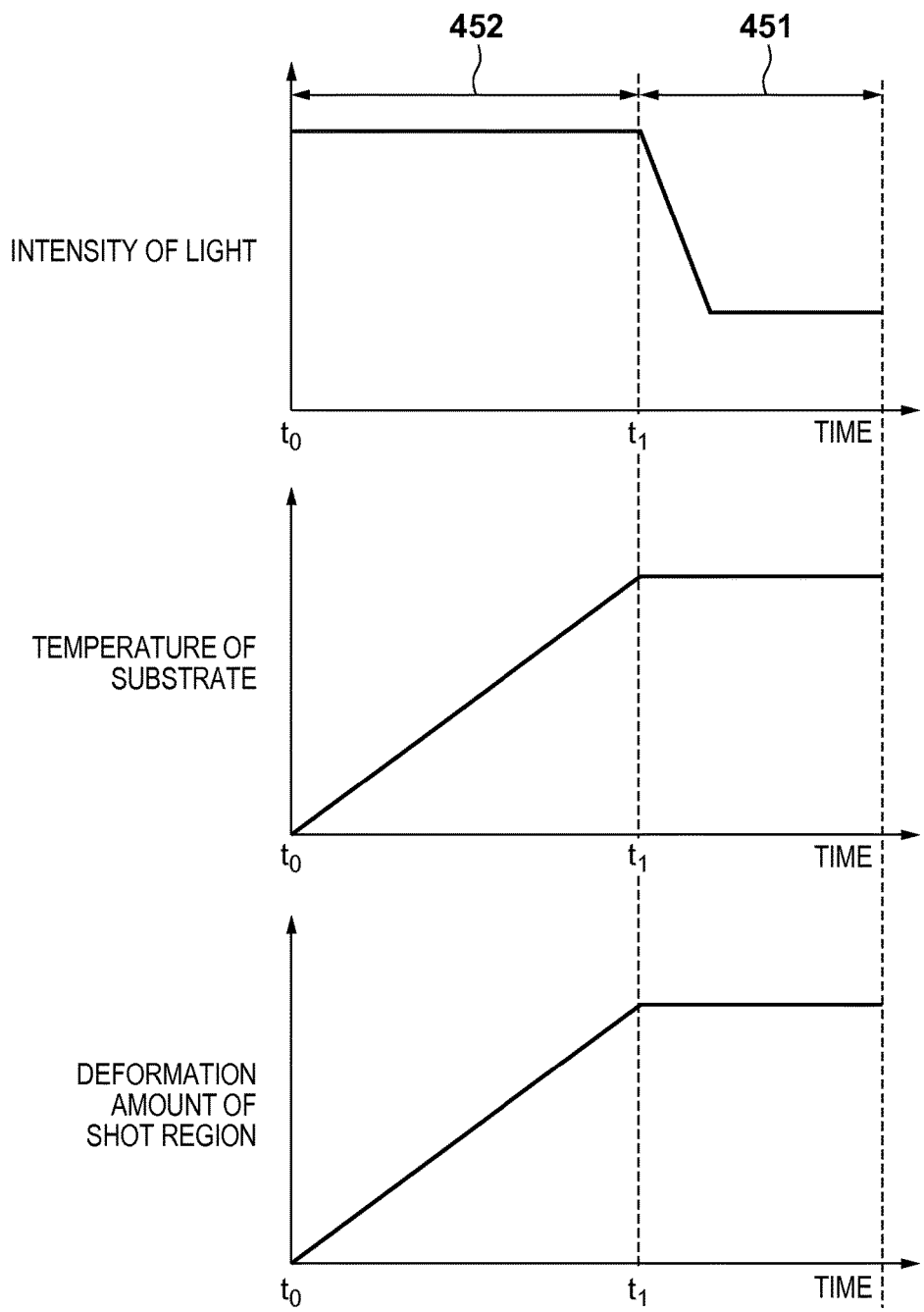
FIG. 18 is a graph showing changes of the intensity of light irradiating the lower surface of a substrate by a heating unit, the temperature of the substrate, and the deformation amount of a shot region with respect to the time.

For example, a case will be examined, in which the substrate 410 is heated while keeping constant the intensity of light irradiating the lower surface of the substrate 410 by the heating unit 437 in a period 452 (between time $t_0$ and time $t_1$) in which the shot region 420a is being deformed, as shown in FIG. 18. In this case, in the period 452 (between time $t_0$ and time $t_1$), the temperature of the substrate 410 linearly rises, and the deformation amount of the shot region 420a also linearly increases. At time $t_1$ when the difference between the shape of the shot region 420a and the target shape falls within an allowable range, the control unit 407 decreases the intensity of light irradiating the lower surface of the substrate 410 by the heating unit 437 so as to maintain the temperature of the substrate 410 at a temperature at time $t_1$. Accordingly, the state in which the difference between the shape of the shot region 420a and the target shape falls within the allowable range can be maintained in the period 451 in which the resin 414 is being cured. The intensity of light after time $t_1$ (period 451) can be set so that the magnitude of heat applied to the substrate 410 by irradiating the substrate 410 with light by the heating unit 437 becomes almost equal to the magnitude of heat radiated from the substrate 410. Heat radiated from the shot region 420a can include, for example, heat diffused in the substrate 410, heat transferring from the substrate 410 to air or the like, and heat transferring from the substrate 410 to the substrate chuck 416.

In step S609, the control unit 407 controls the mold driving unit 412 to separate (release) the mold 408 from the resin 414 on the substrate. In step S610, the control unit 407 determines whether the shot region 420 (next shot region 420) in which the pattern of the mold 408 is subsequently transferred exists on the substrate. If the next shot region 420 exists, the process returns to step S602. If the next shot region 420 does not exist, the imprint process ends. In FIG. 16, the pattern region 408a of the mold 408 and the shot region 420a of the substrate 410 are aligned while the mold 408 and the resin 414 on the substrate are in contact with each other. However, the present invention is not limited to this. For example, the mold 408 and the resin 414 on the substrate may come into contact with each other after the alignment. That is, in FIG. 16, step S604 may be performed after step S607.

As described above, in the imprint apparatus 400 according to the fourth embodiment, the substrate holding unit 404 includes the heating unit 437 which irradiates the lower surface of the substrate 410 with light to heat the substrate 410 and deform the shot region 420. The imprint apparatus 400 (control unit 407) according to the fourth embodiment controls the heating unit 437 so that the shape difference between the pattern region 408a of the mold 408 and the shot region 420 of the substrate 410 falls within an allowable range. The pattern region 408a of the mold 408 and the shot region 420 of the substrate 410 can be superposed at high accuracy, and the pattern of the mold 408 can be transferred to the shot region 420 at high accuracy.

Figure 19A:
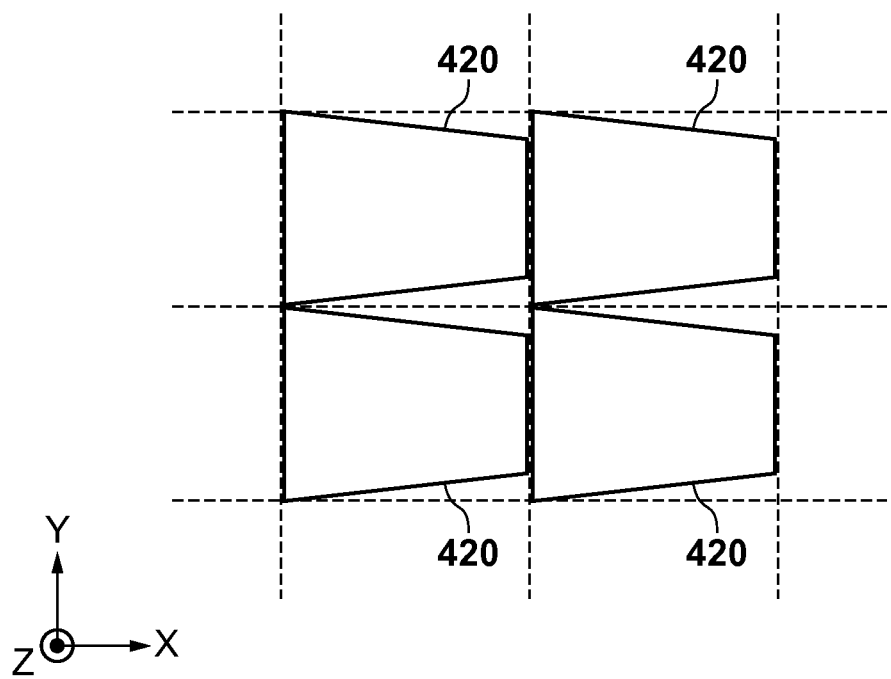
FIG. 19A is a view showing the arrangement of a plurality of shot regions to be deformed by the heating unit.
Figure 19B:
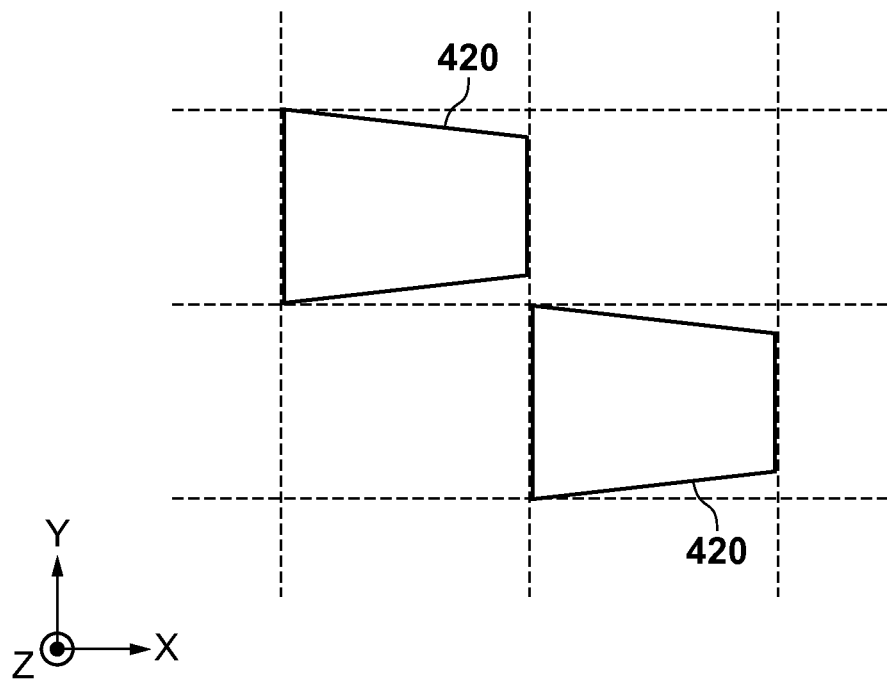
FIG. 19B is a view showing the arrangement of a plurality of shot regions to be deformed by the heating unit.

The fourth embodiment has explained an example in which the heating unit 437 corrects the shape of one shot region 420a formed on the substrate 410, and the imprint process is performed in the shot region 420a. However, the present invention is not limited to this. For example, the heating unit 437 may correct at once the shapes of the plurality of shot regions 420 formed on the substrate 410, such as four shot regions 420 arrayed as shown in FIG. 19A, or two shot regions 420 diagonally arranged as shown in FIG. 19B. Also, the fourth embodiment has explained an example in which when deforming the shot region 420a to be imprinted, the lower surface of the shot region 420a is irradiated with light. However, the present invention is not limited to this. For example, when deforming the shot region 420a, the lower surface of the shot region 420 arranged near the shot region 420a may be irradiated with light. The shape of the shot region 420a can efficiently come close to a target shape (shape of the pattern region 408a deformed by the deformation unit 438).

<Embodiment of Method of Manufacturing Article>

A method of manufacturing an article according to the embodiment of the present invention is suitable for manufacturing an article such as a microdevice (for example, a semiconductor device) or an element having a microstructure. The method of manufacturing an article according to the embodiment includes a step of forming, by using the imprint apparatus, a pattern on a resin applied to a substrate (step of performing the imprint process on a substrate), and a step of processing the substrate on which the pattern has been formed in the preceding step. Further, the manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-216754 filed on Oct. 17, 2013, and Japanese Patent Application No. 2013-270124 filed on Dec. 26, 2013, which are hereby incorporated by reference herein in their entirety.

What is claimed is:

1. An imprint apparatus configured to perform an imprint process of forming a pattern of an imprint material on a substrate by using a mold, for each region of a plurality of regions in the substrate, the apparatus comprising:
   an exposure unit configured to emit light for curing the imprint material on a region of the plurality of regions in the substrate;
   a heating unit configured to emit light to heat the region of the plurality of regions in the substrate, thereby deforming the substrate;
   a substrate stage configured to position the substrate so that two or more regions of the plurality of regions in the substrate are exposed to the light emitted by the exposure unit or the light emitted by the heating unit in a particular order; and
   a processing unit configured to select a first order or a second order of performing the imprint process for a first region and a second region of the plurality of regions, the first order performing the imprint process of the first region prior to performing the imprint process of the second region, and the second order performing the imprint process of the second region prior to performing the imprint process of the first region, by:
      estimating a first deformation amount of the second region in a case where the imprint process is performed for the first region before the second region;
      estimating a second deformation amount of the first region in a case where the imprint process is performed for the second region before the first region;
      in a case where the first deformation amount is smaller than the second deformation amount, selecting the first order of performing the imprint process;
      in a case where the second deformation amount is smaller than the first deformation amount, selecting the second order of performing the imprint process; and
      controlling the substrate stage to position the two or more regions of the plurality of regions on the substrate based on the selected first order or second order,
   wherein the heating unit is configured to deform the substrate such that a shot region corresponding to a region of the plurality of regions being subjected to the imprint process based on the selected first order or second order is deformed to a target shape of the shot region prior to curing the imprint material on the shot region by the exposure unit.

2. The apparatus according to claim 1, wherein the first region and the second region are arranged to be adjacent to each other on the substrate.

3. The apparatus according to claim 1, wherein the processing unit is configured to select the first order of performing the imprint process or the second order of performing the imprint process based on a difference between a shape of the first region and a corresponding target shape of the first region, and a difference between a shape of the second region and a corresponding target shape of the second region.

4. The apparatus according to claim 1, wherein the processing unit is configured to select the first order of performing the imprint process or the second order of performing the imprint process based on a thermal dose to be applied to the substrate for performing the imprint process of the first region, and a thermal dose to be applied to the substrate for performing the imprint process of the second region.

5. The apparatus according to claim 4, wherein the processing unit is configured to adjust, based on a thermal dose for a shot region to which the imprint process is performed first of the first region and the second region, a thermal dose for another shot region to which the imprint process is performed subsequently of the first region and the second region.

6. An imprint apparatus configured to perform an imprint process of forming a pattern of an imprint material on a substrate by using a mold, for each region of a plurality of regions in the substrate, the apparatus comprising:
   an exposure unit configured to emit light for curing the imprint material on a region of the plurality of regions in the substrate;
   a heating unit configured to emit light to heat the region of the plurality of regions in the substrate, thereby deforming the substrate;
   a substrate stage configured to position the substrate so that two or more regions of the plurality of regions in the substrate are exposed to the light emitted by the exposure unit or the light emitted by the heating unit in a particular order; and a processing unit configured to determine a second region, of the plurality of regions, for performing the imprint process subsequent to performing the imprint process of a first region, of the plurality of regions, wherein the imprint process of the first region includes deforming the substrate by the heating unit such that the first region is deformed to a target shape of the first region, by:

estimating deformation amounts of regions adjacent to the first region after performing the imprint process of the first region; and selecting, as the second region, a region whose estimated deformation amount is smallest among the regions adjacent to the first region.

7. The apparatus according to claim 6, wherein the processing unit is configured to select the second region based on a heating distribution to be formed in the first region by the heating unit for performing the imprint process of the first region.

8. An imprint apparatus configured to perform an imprint process of forming a pattern of an imprint material on a substrate by using a mold, for each region of a plurality of regions which are arrayed in the substrate, the apparatus comprising:

an exposure unit configured to emit light for curing the imprint material on a region of the plurality of regions in the substrate;

a heating unit configured to emit light to heat the region of the plurality of regions in the substrate, thereby deforming the substrate;

a substrate stage configured to position the substrate so that two or more regions of the plurality of regions in the substrate are exposed to the light emitted by the exposure unit or the light emitted by the heating unit in a particular order; and a processing unit configured to determine an order of operation for performing the imprint process for the plurality of regions to be one of a first order of performing the imprint process along a first direction parallel to an array direction of the plurality of regions, or a second order of performing the imprint process along a second direction opposite to the first direction, based on information of a shape of each region of the plurality of regions, wherein the heating unit is configured to deform the substrate such that a shot region corresponding to a region of the plurality of regions being subjected to the imprint process is deformed to a target shape of the shot region.

9. The apparatus according to claim 8, wherein the processing unit is configured to evaluate the shape of each of the plurality of regions by using an evaluation function, and determine the order of operation for performing the imprint process for the plurality of regions based on a result of the evaluation.

10. The apparatus according to claim 8, wherein, in a case where a region, of the plurality of regions, in which a thermal dose by the heating unit in the imprint process is likely to exceed a threshold is specified among the plurality of regions, the processing unit is configured to change the determined order of operation for performing the imprint process for the plurality of regions so as to finally perform the imprint process for the specified region.

11. The apparatus according to claim 1, wherein the heating unit includes a light source, and heats the substrate by irradiating the substrate with light emitted by the light source.

12. The apparatus according to claim 1, wherein the processing unit is configured to successively perform the imprint process of the first region and the imprint process of the second region.

13. The apparatus according to claim 8, further comprising a measurement unit configured to measure the shape of each region of the plurality of regions, wherein the processing unit is configured to obtain the information based on a measurement result of the measurement unit.

14. The apparatus according to claim 8, wherein the plurality of regions arrayed on the substrate are arranged as a plurality of region arrays, and wherein the processing unit is configured to determine the order of performing the imprint process for each region array of the plurality of region arrays.

15. The apparatus according to claim 8, wherein the processing unit is configured to determine the order of operation for performing the imprint process for the plurality of regions based on heat remaining in the substrate in a case where the heating unit deforms each of the plurality of regions sequentially.

16. The apparatus according to claim 6, wherein the processing unit is configured to estimate the deformation amounts of regions adjacent to the first region by estimating influence of heat remaining in the substrate after performing the imprint process of the first region.

* * * * *